(12) United States Patent
Fujiwara

(10) Patent No.: US 10,115,747 B2
(45) Date of Patent: Oct. 30, 2018

(54) METHOD OF PRODUCING COMPONENT BOARD

(71) Applicant: Sharp Kabushiki Kaisha, Sakai, Osaka (JP)

(72) Inventor: Masaki Fujiwara, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/541,826

(22) PCT Filed: Dec. 25, 2015

(86) PCT No.: PCT/JP2015/086198
§ 371 (c)(1),
(2) Date: Jul. 6, 2017

(87) PCT Pub. No.: WO2016/111197
PCT Pub. Date: Jul. 14, 2016

(65) Prior Publication Data
US 2017/0365628 A1    Dec. 21, 2017

(30) Foreign Application Priority Data

Jan. 6, 2015 (JP) .................................. 2015-000726

(51) Int. Cl.
*B32B 7/06* (2006.01)
*B32B 38/00* (2006.01)
(Continued)

(52) U.S. Cl.
CPC ............ *H01L 27/1266* (2013.01); *B32B 7/06* (2013.01); *B32B 38/0008* (2013.01);
(Continued)

(58) Field of Classification Search
USPC .... 156/64, 247, 272.2, 272.8, 701, 712, 719
See application file for complete search history.

(56) References Cited

U.S. PATENT DOCUMENTS 5,587,130 A * 12/1996 Bao ........................... C23C 8/10
338/34
5,777,335 A * 7/1998 Mochizuki ............ G01T 1/2018
250/370.09

(Continued)

FOREIGN PATENT DOCUMENTS

JP          3809833 B       8/2006

*Primary Examiner* — Sing P Chan
(74) *Attorney, Agent, or Firm* — ScienBiziP, P.C.

(57) ABSTRACT

A method of producing a CF board and an array board includes: a separation film forming process for forming separation films on supporting substrates; a component support forming process for forming resin substrates on the separation films; a thin film component forming process for forming TFTs and color filters that are thin film components on the resin substrates; a light applying process for applying light to the separation films for accelerating removals of the resin substrates; a determining process for determining whether levels of adhesion between the separation films and the resin substrates are high or low based on image data obtained through capturing of images of the separation films, and a removing process for removing the resin substrates from the supporting substrates if the levels of adhesion are determined low in the determining process.

8 Claims, 19 Drawing Sheets

(51) Int. Cl.
  *B32B 38/10* (2006.01)
  *H01L 21/683* (2006.01)
  *H01L 27/12* (2006.01)
  *H01L 29/786* (2006.01)
  *G02F 1/1333* (2006.01)
  *G02F 1/1335* (2006.01)
  *G02F 1/1337* (2006.01)
  *G02F 1/1343* (2006.01)
  *G02F 1/136* (2006.01)
  *G02F 1/1368* (2006.01)

(52) U.S. Cl.
  CPC ............ *B32B 38/10* (2013.01); *G02F 1/1337* (2013.01); *G02F 1/1368* (2013.01); *G02F 1/13439* (2013.01); *G02F 1/133305* (2013.01); *G02F 1/133514* (2013.01); *G02F 1/133528* (2013.01); *G02F 2001/13613* (2013.01); *G02F 2201/123* (2013.01); *H01L 27/124* (2013.01); *H01L 27/1225* (2013.01); *H01L 29/7869* (2013.01)

(56) References Cited

U.S. PATENT DOCUMENTS

| | | | |
|---|---|---|---|
| 6,127,199 A | 10/2000 | Inoue et al. | |
| 6,372,608 B1 | 4/2002 | Shimoda et al. | |
| RE38,466 E | 3/2004 | Inoue et al. | |
| RE40,601 E | 12/2008 | Inoue et al. | |
| 7,538,401 B2 * | 5/2009 | Eriksen | C23C 14/021 257/419 |
| 7,642,115 B2 * | 1/2010 | Eriksen | C23C 14/021 257/E29.324 |
| 7,952,154 B2 * | 5/2011 | Guo | C23C 14/021 257/417 |
| 8,013,405 B2 * | 9/2011 | Eriksen | C23C 14/021 257/417 |
| 8,196,455 B2 * | 6/2012 | Anderson | G01N 29/022 73/61.49 |
| 8,460,961 B2 * | 6/2013 | Guo | C23C 14/021 257/E21.533 |
| 8,861,218 B2 * | 10/2014 | Smith | B81B 7/04 361/760 |
| 9,266,717 B2 * | 2/2016 | Gogoi | H01L 27/14 |
| 9,444,004 B1 * | 9/2016 | Spence | H01L 31/18 |
| 9,758,368 B2 * | 9/2017 | Gogoi | H01L 27/14 |
| 9,844,328 B2 * | 12/2017 | Simpson | A61B 5/6848 |
| 9,890,038 B2 * | 2/2018 | Gogoi | H01L 27/14 |
| 9,899,559 B2 * | 2/2018 | Spence | H01L 31/18 |
| 9,998,643 B2 * | 6/2018 | Sulfridge | H04N 5/2253 |
| 2002/0146893 A1 | 10/2002 | Shimoda et al. | |
| 2003/0224582 A1 | 12/2003 | Shimoda et al. | |
| 2004/0219762 A1 | 11/2004 | Shimoda et al. | |
| 2006/0030122 A1 | 2/2006 | Shimoda et al. | |
| 2007/0010067 A1 | 1/2007 | Shimoda et al. | |
| 2009/0108382 A1 * | 4/2009 | Eriksen | C23C 14/021 257/419 |
| 2009/0203163 A1 * | 8/2009 | Eriksen | C23C 14/021 438/51 |
| 2010/0065934 A1 * | 3/2010 | Eriksen | C23C 14/021 257/419 |
| 2010/0116035 A1 * | 5/2010 | Anderson | G01N 29/022 73/61.49 |
| 2010/0116632 A1 * | 5/2010 | Smith | B81B 7/04 200/181 |
| 2010/0155866 A1 * | 6/2010 | Guo | C23C 14/021 257/419 |
| 2010/0203649 A1 * | 8/2010 | Thrier | G01N 31/225 436/127 |
| 2011/0256652 A1 * | 10/2011 | Guo | C23C 14/021 438/53 |
| 2014/0107450 A1 * | 4/2014 | Simpson | A61B 5/6848 600/365 |
| 2014/0213866 A1 * | 7/2014 | Simpson | A61B 5/6848 600/345 |
| 2014/0264657 A1 * | 9/2014 | Gogoi | H01L 27/14 257/416 |
| 2015/0107761 A1 * | 4/2015 | McArdle | B32B 37/182 156/247 |
| 2015/0289788 A1 * | 10/2015 | Simpson | A61B 5/1473 600/345 |
| 2015/0376466 A1 * | 12/2015 | Mitamura | C09J 7/00 428/41.5 |
| 2016/0089065 A1 * | 3/2016 | Simpson | A61B 5/6848 600/347 |
| 2016/0089068 A1 * | 3/2016 | Simpson | A61B 5/6848 600/347 |
| 2016/0113556 A1 * | 4/2016 | Simpson | A61B 5/6848 600/347 |
| 2016/0167953 A1 * | 6/2016 | Gogoi | H01L 27/14 257/414 |
| 2016/0167954 A1 * | 6/2016 | Gogoi | H01L 27/14 257/415 |
| 2016/0286102 A1 * | 9/2016 | Sulfridge | H04N 5/2253 |
| 2016/0351746 A1 * | 12/2016 | Spence | H01L 31/18 |
| 2017/0234822 A1 * | 8/2017 | Ruhl | G01N 15/10 324/679 |
| 2017/0355596 A1 * | 12/2017 | Gogoi | H01L 27/14 |
| 2017/0365628 A1 * | 12/2017 | Fujiwara | H01L 27/1266 |
| 2018/0042529 A1 * | 2/2018 | Simpson | A61B 5/1473 |
| 2018/0111332 A1 * | 4/2018 | Collis | B29C 66/92211 |
| 2018/0170746 A1 * | 6/2018 | Gogoi | B81B 7/02 |

* cited by examiner

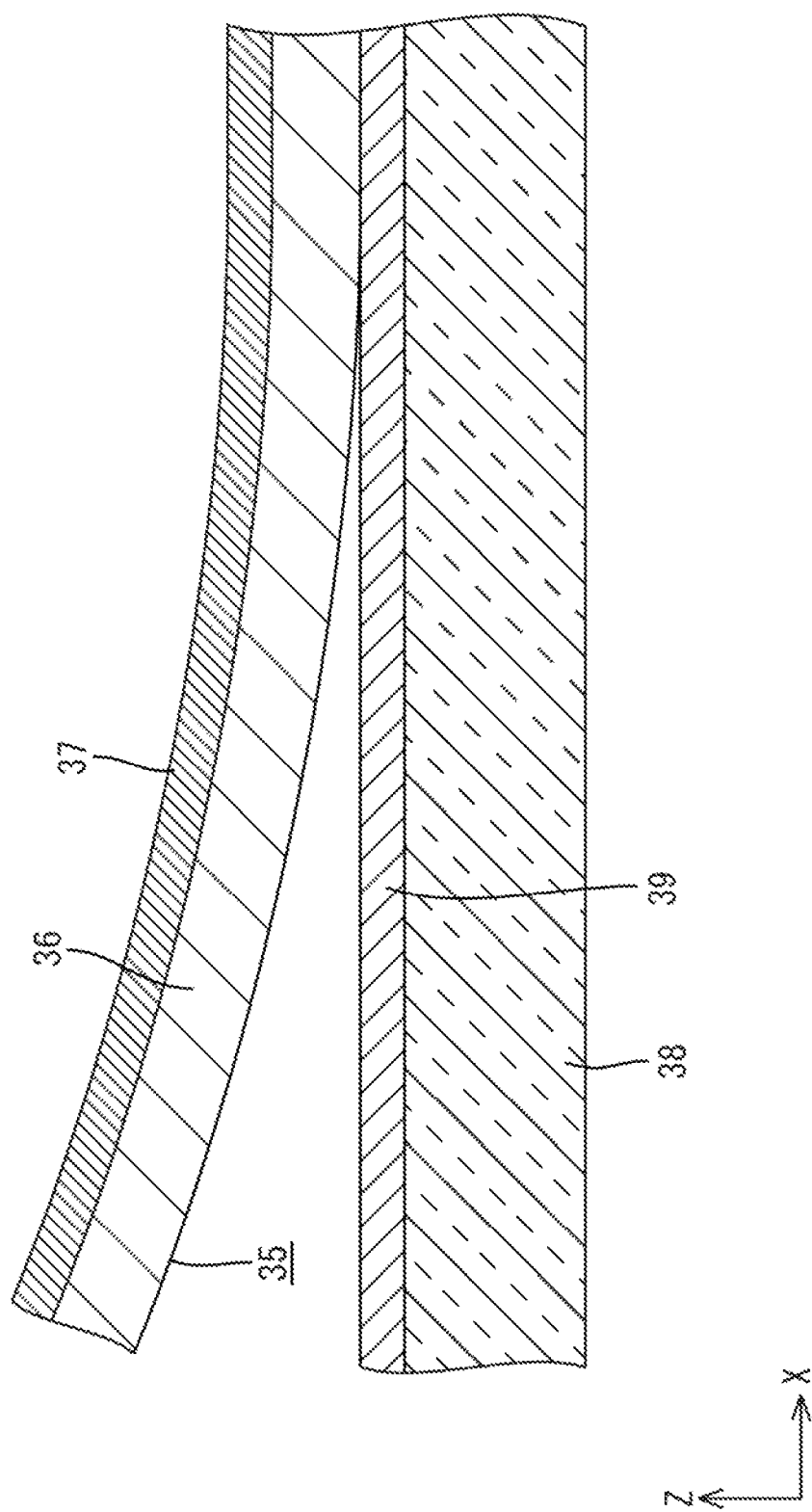

METHOD OF PRODUCING COMPONENT BOARD

TECHNICAL FIELD

The present invention relates to a method of producing a component board.

BACKGROUND ART

A method of transferring a thin film component on a substrate onto a transfer body disclosed in Patent Document 1 has been known. In the method of transferring the thin film component in Patent Document 1, a separation layer is provided on the substrate that allows laser light to pass through. The laser light is applied to the thin film component such as a TFT formed on the substrate from the substrate side to separate the separation layer. Then, the thin film component is bonded to the transfer body with an adhesive layer and the substrate is removed. According to the method, a desired thin film device can be transferred to any kind of substrate.

RELATED ART DOCUMENT

Patent Document

Patent Document 1: Japanese Patent Publication No. 3809833.

Problem to be Solved by the Invention

According to the method of transferring a thin film component disclosed in Patent Document 1, an output level of light may be reduced due to variation in a laser oscillator or optical system or a target position of the laser light during application of the laser light to the separation film. This may cause variations in irradiation energy or thermal conditions and thus the separation of the separation film is more likely to occur. Namely, the separation film is forcedly removed from a glass and thus a yield may decrease. If the laser light is applied to an area with a spot beam of 1 mm or smaller using a galvano scanner method, variations in energy or irradiation diameter or variations in target position are more likely to occur among shots.

DISCLOSURE OF THE PRESENT INVENTION

The present invention was made in view of the above circumstances. An object is to improve a yield.

Means for Solving the Problem.

A method of producing a component board according to the present invention includes: a separation film forming process for forming a separation film on a supporting substrate; a component support forming process for forming a component support for forming a component support on the separation film; a thin film component forming process for forming a thin film component on the component support; a light applying process for applying light to the separation film for accelerating a removal of the component support; a determining process for determining whether a degree of adhesion between the separation film and the component support is high or low based on image data obtained through capturing of an image of the separation film and a removing process for removing the component support from the supporting substrate if the degree of adhesion is determined low in the determining process.

Through the separation film forming process, the separation film is formed on the supporting substrate. Through the component support forming process, the component support is formed on the separation film. The component support on which a thin film component is formed is supported with the supporting substrate via the separation film. Therefore, the component support is provided with sufficient strength and thus the thin film component is properly detectable. Through the light applying process, the separation film is irradiated with light for accelerating the removal of the component support. If an output level and a position of the light applied to the separation film are proper, the degree of adhesion between the separation film and the component support (a degree of adhesion resulting from energy of applied light and a thermal factor) sufficiently decreases. Therefore, the removal of the component support performed afterward becomes easier. If the output level of the light applied to the separation film is not sufficient or the position of the application of the light is not proper, the degree of adhesion between the separation film and the component support does not sufficiently decrease and thus the removal of the component support in the removing process becomes difficult. If the removal of the component support, is performed although the degree of adhesion between the separation film and the component support is high, a defect may be produced in the component support or the thin film component.

In the determining process performed after the light applying process, whether the degree of adhesion between the separation film, and the component support is high or low is determined based on the image date obtained through capturing of the image of the separation film. If the degree of adhesion between the separation film and the component support (a degree of adhesion resulting from energy of the applied light and a thermal factor) is determined sufficiently low in the determining process, the removing process is performed and the component support can be easily removed from the supporting substrate. If the degree of adhesion between the separation film and the component support (the degree of adhesion resulting from, energy of the applied light and the thermal factor) is determined not sufficiently low, that is, high, the irradiation of light in the light applying process is not proper. Therefore, the production may be stopped to improve the light applying process or the light may be reapplied to the separation film, the degree of adhesion of which is determined high. The removing process is less likely to be performed if the irradiation of light in the light applying process is not proper. Therefore, the defect is less likely to be produced in the component support and thus the yield improves.

Preferable Embodiments According to the Present Invention may Include the Following Configurations.

(1) The determining process may include: image thresholding the image data; extracting a highly attached portion having a high degree of adhesion; and determining whether or not the degree of adhesion is high or low based on whether an occupancy rate of an area of the highly attached portion over an entire area of the separation film is higher than a threshold or the area of the highly attached portion is higher than a threshold. In comparison to a determining process in which whether the degree of adhesion is high or low is determined based through inspection by a person, criteria for the determination of the degree of adhesion are clearer. Therefore, more accurate determination result can be obtained in the determining process and the takt time of the determining processes can foe reduced. Furthermore, the degree of adhesion can be calculated through image data and simple image processing and thus inline processing using an image capturing device such as a CCD camera is possible.

(2) The determining process may include: obtaining the image data through capturing of images of multiple in-plane portions of the separation film; extracting the highly attached portion from the image data including the images; and determining whether the degree of adhesion is high or low based on whether or not the occupancy rate of the highly attached portion is higher than the threshold or the area of the highly attached portion is larger than the threshold. In comparison to a determining process in which the highly attached portion is extracted from the image data obtained through capturing of an image of the entire area of the separation film, the takt time of the determining processe can be further reduced.

(3) The threshold for the occupancy rate of the highly attached portion in the determining process may be 2.9%. If the occupancy rate of the highly attached portion is higher than 2.9%, the degree of adhesion between the separation film and the component support is high. Namely, an excessive force is required for the removal in the removing process. Therefore, a damage or a defect is more likely to occur in the component support. With the threshold for the occupancy rate of the highly attached portion in the determining process set to 2.9%, the high degree of adhesion between the separation film and the component support may be properly detectable. The threshold may be set to a different value according to a configuration (an optical system, an oscillator) of a light source that emits light (e.g., Gaussian laser beams) or a thermal configuration of a sample (absorption rate of the separation film or thermal conductivity or thermal capacity of material of the sample).

(4) The threshold for the occupancy rate of the highly attached portion in the determining process may be 1.8%. If the occupancy rate of the highly attached portion is higher than 2.9%, the degree of adhesion between the separation film and the component support is high and thus the excessive force is required for the removal in the removing process. Therefore, the damage or the defect is more likely to occur in the component support. Furthermore, if the occupancy rate of the highly attached portion is higher than 1.8% even through it is lower than 2.9%, a defect is more likely to occur in the thin film, component due to stress during the removal of the component support in the removing process. With the threshold for the occupancy rate of the highly attached portion in the determining process set to 1.8%, the high degree of adhesion between the separation film and the component support is properly detectable and thus the defect is less likely to occur in the thin film component. Therefore, the yield may further improve. The threshold may be set to a different value according to a configuration (an optical system, an oscillator) of a light source that emits light (e.g., Gaussian laser beams) or a thermal configuration of a sample (absorption rate of the separation film or thermal conductivity or thermal capacity of material of the sample).

(5) The determining process may include determining whether or not the degree of adhesion is too low based on whether the occupancy rate of the highly attached portion is higher than a second threshold or the area of the highly attached portion is larger than a second threshold. The second thresholds may be lower and smaller than the respective thresholds. If the degree of adhesion between the separation film and the component support is too low, the component support may be unexpectedly removed from the supporting substrate. Therefore, deformation or displacement of the component support is more likely to occur. The removal of the component support in the removing process may become difficult. In the determining process, the degree of adhesion is determined properly low but not too low if the occupancy rate of the highly attached portion is higher than the second threshold that is lower or the area of the highly attached portion is larger than the second threshold that is smaller. If the occupancy rate of the highly attached portion is lower than the second threshold or the area of the highly attached portion is smaller than the second threshold, the degree of adhesion is determined too low. If the degree of adhesion is determined too low, the production may be stopped to improve the light applying process.

(6) The second threshold for the occupancy rate of the highly attached portion may be 0.85%. If the occupancy rate of the highly attached portion is lower than 0.85%, the component, support may be unexpectedly removed from the supporting substrate. Therefore, the deformation or the displacement of the component support is more likely to occur. The removal of the component support in the removing process may become difficult. With the second threshold for the occupancy rate of the highly attached portion in the determining process set to 0.85%, the degree of adhesion which is too low may be properly detectable. The threshold may be set to a different value according to a configuration (an optical system, an oscillator) of a light source that emits light (e.g., Gaussian laser beams) or a thermal configuration of a sample (absorption rate of the separation film or thermal conductivity or thermal capacity of material of the sample).

(7) The supporting substrate used for forming the separation film in the separation film forming process may have light transmissivity. The light applying process may include applying light to the separation film from a supporting substrate side. Because the supporting substrate has the light transmissivity, the separation film is irradiated with the light that has passed through the supporting substrate. Therefore, the thin film component formed on the component support is less likely to be irradiated with the light and thus the defect is less likely to occur in the thin film component.

(8) The separation film forming process may include forming the separation film using a refractory metal. The separation film made of refractory metal is less likely to be melted with its own heat and the separation film efficiently convers the light applied in the light applying process into heat. Therefore, separation is more likely to occur at an interface between the separation film and the component support. The "refractory metal" refers to a metal with a melting point of 1200° C. or higher.

(9) The separation film forming process may include forming the separation film using molybdenum, for the refractory metal and with a thickness equal to or larger than 150 nm. The light applied in the light applying process hardly pass through the separation film and thus the thin film component is further less likely to be irradiated with the light. Therefore, the defect is further less likely to occur in the thin film component. If the light is ultraviolet light and the ultraviolet light is absorbed by the component support, the surface of the component support may be damaged due to abrasion phenomenon by the light or due to the heat and becomes irregular. Therefore, a haze (a haze level) can be reduced.

(10) The light applying process may include applying laser beams as the light. By applying the laser beams having high energy to the separation film in the light applying process, a temperature of portions to which the laser beams are applied sharply increase and thus separation between the separation film and the component support can be accelerated.

Advantageous Effect of the Invention

According to the present invention, the yield improves.

BRIEF DESCRIPTION OF THE DRAWINGS

FIG. 19 is a cross-sectional view illustrating a removal of the flexible scanner from the supporting substrate and a separation film in the production of the flexible scanner.

MODE FOR CARRYING OUT THE INVENTION

<First Embodiment>

Figure 1:
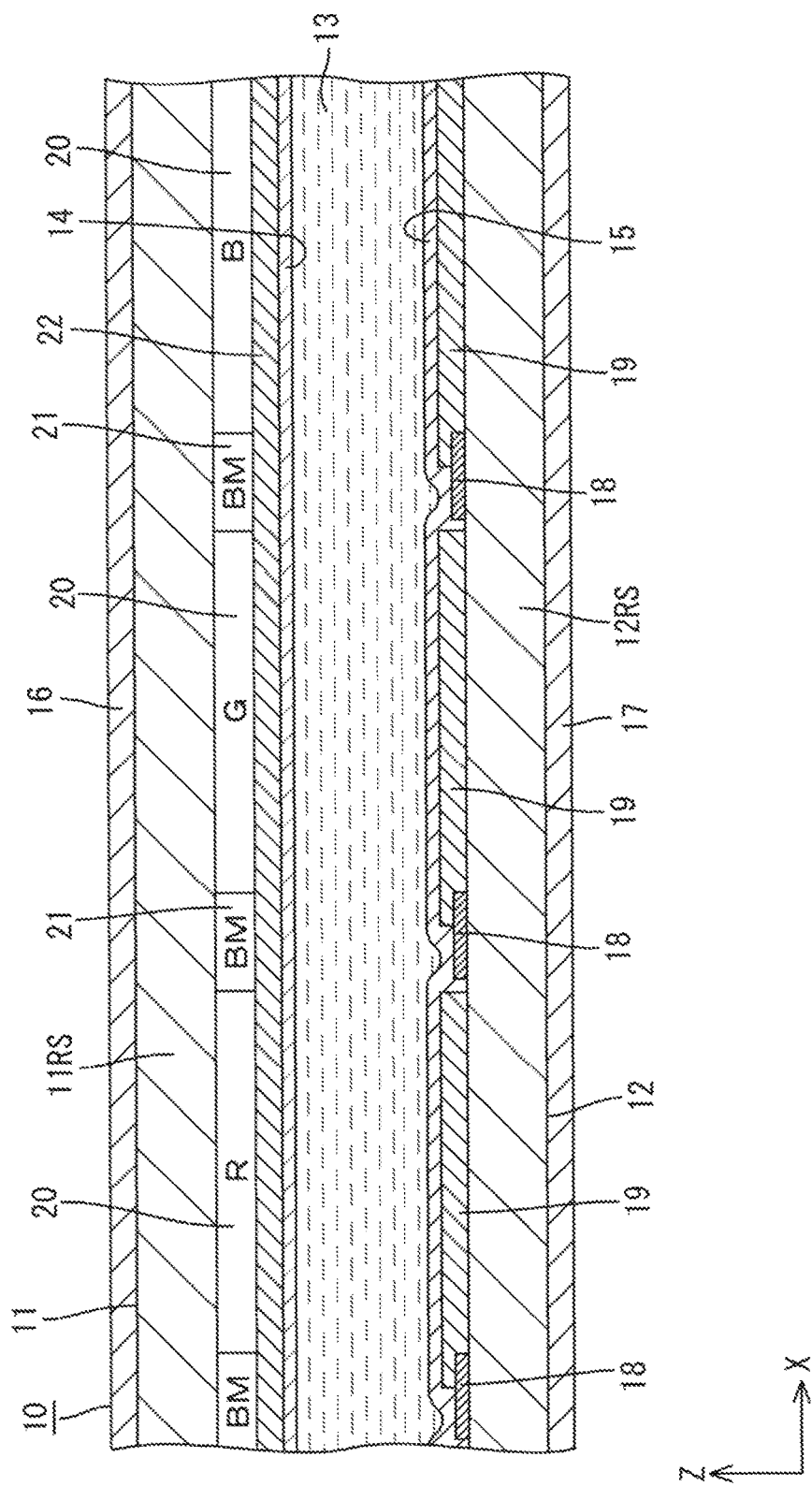
FIG. 1 is a cross-sectional view of a liquid crystal panel according to a first embodiment of the present invention.

A first embodiment according to the present invention will be described with reference to FIGS. 1 to 15. In this section, a method of producing a liquid crystal panel 10 will be described. X-axes, Y-axes, and Z-axes may be present in the drawings. The axes in each drawing correspond to the respective axes in other drawings. The vertical direction is based on FIG. 1. An upper side and a lower side in FIG. 1 correspond to a front side and a back side of the liquid crystal panel 10, respectively.

As illustrated in FIG. 1, the liquid crystal panel 10 includes a pair of boards 11 and 12 and a liquid crystal layer 13 that is between the boards 11 and 12. The liquid crystal layer 13 includes liquid crystal molecules. The liquid crystal molecules are substances having optical characteristics that alter according to application of electric field. The boards 11 and 12 are disposed with a cell gap corresponding to a thickness of the liquid crystal layer 13 and bonded together with a sealing member that is not illustrated. The boards 11 and 12 include substantially transparent resin substrates (component supports, flexible bases) 11RS and 12 RS (having high light transmissivity)r respectively. The resin substrates 11RS and 12RS are made of synthetic resin material. Films are formed in layers on the resin substrates 11RS and 12RS by a known, photolithography technology, respectively. Each of the resin substrates 11RS and 12RS has a thickness in a range from 2 μm to 200 μm. In comparison to glass substrates, the resin substrates 11RS and 12RS have higher flexibility. Therefore, the liquid crystal panel 11 can more flexibly change its shape, Polyimide or polyamide may be preferable for the synthetic resin material of the resin substrates 11RS and 12RS. The polyimide and the polyamide are resistant to heat equal to or higher than 300° C., that is, they have high thermal resistance. Furthermore, the polyimide and the polyamide have small linear expansion coefficients. The resin substrates 11RS and 12RS in this embodiment are made of polyimide that is synthetic resin having decomposition temperature of about 500° C., that is, having especially high thermal resistance. One of the boards 11 and 12 on the front side is a CF board 11 (a component board, a counter board). The other one of the boards 11 and 12 on the back side (the rear side) is an array board 12 (a component board, an active matrix board). Alignment films 14 and 15 are formed on inner surfaces of the board 11 and 12, respectively, for aligning the liquid crystal molecules included in the liquid crystal layer 13. Polarizing plates 16 and 17 are attached to outer surfaces of the boards 11 and 12, respectively.

As illustrated in FIG. 1, thin film transistors (TFTs) 18 that are switching components and pixel electrodes 19 are arranged in a matrix on the inner surface of the array board 12 (on the liquid crystal layer 13 side, on the opposed surface side to the CF board 11). Furthermore, gate lines and source lines (not illustrated) are routed in a grid to surround the TFTs 18 and the pixel electrodes 19. Namely, the TFTs 18 and the pixel electrodes 19 are arranged at intersections of the gate lines and the source lines that are in the grid to form the matrix. The gate lines and the source lines are connected to gate electrodes 18*a* and source electrodes 18*b* of the TFTs 18, respectively. The pixel electrodes 19 are connected to drain electrodes 18*c* of the TFTs 18. Each pixel electrode 19 has a vertically long rectangular in a plan view and is made of transparent electrode material such as indium tin oxide (ITO) or zinc oxide (ZnO). The array board 12 may include capacitance lines (not illustrated) which are parallel to the gate lines and cross the pixel electrodes 19.

As illustrated in FIG. 1, color filters 20 are arranged on the inner surface of the CP board 11. The color filters 20 include red (R), green (G), and blue (B) color portions that are arranged in a matrix to overlap the pixel electrodes 19 in the array board 12, respectively in a plan view. A light blocking layer 21 (a black matrix) is formed among the color portions of the color filters 20. The light blocking layer 21 is arranged to overlap the gate lines, the source lines, and the TFTs 18 in a plan view. Solid patterns of counter electrodes 22 are formed on the surfaces of the color filters 20 and the light blocking layer 21. The counter electrodes 22 are opposed to the pixel electrodes pixel electrodes 19 of the array board 12. On a resin substrate 11RS of the CP board 11, the color filters 20, the light blocking layer 21, line counter electrodes 22, and an alignment film 14 are formed in layers. In the liquid crystal panel 10, a group of the R (red) color portion, the G (green) color portion, the B (blue) color portion, and three pixel electrodes 19 opposed to the color portions, respectively, forms one display pixel that is a unit of display. The display pixels include red pixels including the R color portions, green pixels including the G color portions, and blue pixels including the B color portions. The color pixels are repeatedly arranged on a plate surface of the liquid crystal panel 10 along a row direction (the X-axis direction) to form, lines of pixels. The lines of pixels are arranged along a column, direction (the Y-axis direction).

Figure 2:
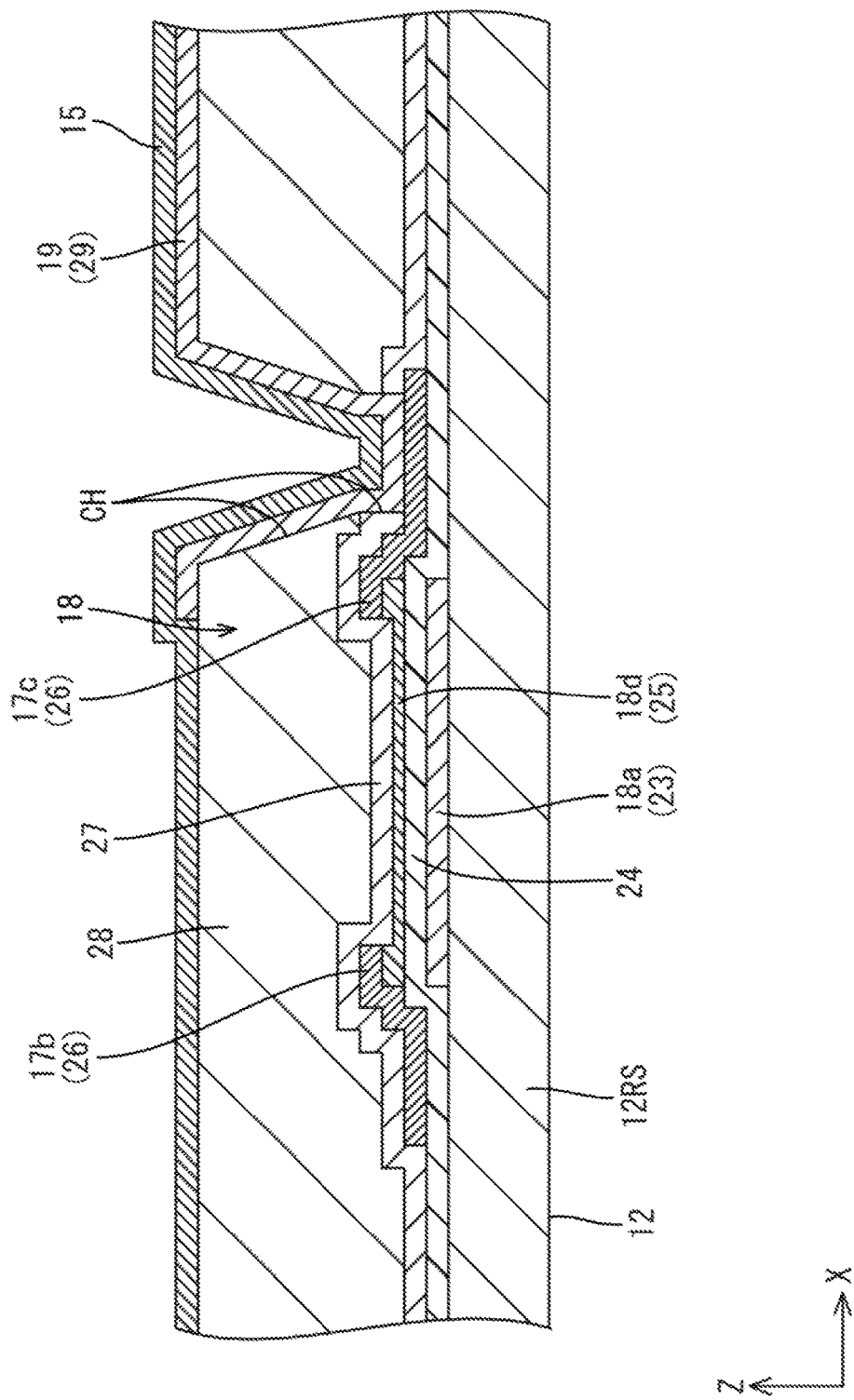
FIG. 2 is a cross-sectional view illustrating a cross-sectional configuration of a portion of an array board including a TFT and therearound.

Films 23 to 29 that are formed in layers on the inner surface of the resin substrate 12RS of the array board 12 will be described. As illustrated in FIG. 2, a first metal film 23 (a gate metal film), a gate insulating film 24, an oxide semiconductor film 25, a second metal film 26 (a source metal film), a protective insulating film 27, an organic insulating film 28, a transparent electrode film 29, and the alignment film 15 are formed in layers on the resin substrate 12RS of the array board 12 in this sequence from the lower layer side.

The first metal film 23 may be a laminated, film of titanium (Ti) and aluminum (Al). The first metal film 23 may form at least the gate lines. The gate insulating film 24 is over at least the first metal film 23. The gate insulating film 24 may be a single-layer film of silicon oxide (SiO), which is an inorganic material or a multi-layer film of oxide silicon and silicon nitride (SiN). At least the silicon oxide is on the upper layer side. With the silicon oxide on the upper layer side, the silicon oxide contacts the oxide semiconductor film 25. Therefore, the oxide contained in the oxide semiconductor film 25 is less likely to be reduced. This configuration is effective for maintaining electrical characteristics of the oxide semiconductor film 25. The oxide semiconductor film 25 is over the gate insulating film 24. A substantially transparent thin film (having high light transmissivity) including an oxide semiconductor material is used for the oxide semiconductor film 25. The oxide semiconductor material for the oxide semiconductor film 25 may be an indium gallium sine oxide (In—Ga—Zn—O) based semiconductor containing indium (In), gallium (Ga), zinc (In), and oxide (O). The In—Ga—Zn—O based semiconductor is a ternary oxide of indium (In), gallium (Ga), and zinc (Zn). A ratio of In, Ga, and Zn (a composition ratio) is not limited to a specific ratio. The ratio may be as follows.

In:Ga:Zn=2:2:1
In:Ga:Zn=1:1:1
In:Ga:Zn=1:1:2

In this embodiment, the In—Ga—Zn—O based semiconductor containing In, Ga, and Zn with a ratio of 1:1:1 is used. Such an oxide semiconductor (the In—Ga—Zn—O based semiconductor) may have an amorphous structure but it is more preferable that the oxide semiconductor includes a crystalline structure including crystalline substances.

The second metal film 26 is formed over at least the oxide semiconductor film 25. The second metal film 26 is a laminated film, of titanium (Ti) and aluminum (Al). The first metal film 23 forms at least the source lines. The protective insulating film 27 is formed over at least the second metal film 26. The protective insulating film 27 is made of silicon oxide (SiO) which is an inorganic material. The organic insulating film 28 is formed over at least the protective insulating film 27. The organic insulating film 28 is made of acrylic based resin material (e.g., polymethylmethacrylate: resin (PMMA)) which is an organic material. The organic insulating film 28 functions as a planarization film. The transparent electrode film 29 is formed over at least the organic insulating film 28. The transparent electrode film 29 is made of transparent electrode material such as indium tin oxide (ITO) and zinc oxide (ZnO). The transparent electrode film 29 forms at least the pixel electrodes 19.

Next, a cross-sectional configuration of each TFT 18 will be described in detail. As illustrated in FIG. 2, the TFT 18 includes a gate electrode 18*a*, a channel 18*d*, a source electrode 18*b*, and a drain electrode 18*c*. The gate electrode 18*a* is formed from the first metal film 23 that forms the gate lines. The channel 18*d* is formed over the gate electrode 18*a* to overlap the gate electrode 18*a* via the gate insulating film 24 in a plan view. The channel 18*d* is formed from the oxide semiconductor film 25. The source electrode 18*b* is formed over the channel 13*d* and connected to one of ends of the channel 18*d*. The source electrode 18*b* is formed from the second metal film 26 that forms the source lines. The drain electrode 18*c* is formed over the channel 18*d* and connected to the other end of the channel 18*d*. The drain electrode 18*c* is formed from the second metal film 26 that forms the source lines. An end of the source electrode 18*b* on a side opposite from the end on the channel 18*d* side is connected to the source line. An end of the drain electrode 18*c* on a side opposite from the end on the channel 18*d* side is connected to the pixel electrode 19 through contact holes CH that are through holes formed in the protective insulating film 27 and the organic insulating film 28. A portion of the channel 18*d* between the ends connected to the source electrode 18*b* and the drain electrode 18*c* is covered with the protective insulating film 27 made, of silicon oxide, The oxide semiconductor film 25 that forms the channel 18*d* has electron mobility 10 to 20 times higher in comparison, to an amorphous silicon thin film. Therefore, the TFT 18 can be easily reduced in size to obtain an optimal amount of light transmitting through the pixel electrode 19. This configuration is preferable for increasing the definition and reducing the power consumption. The TFT 18 is an inversely staggered type transistor having a layered structure similar to that of a TFT including a regular amorphous silicon film.

A method of producing the liquid crystal panel 10 having the above configuration will be described. The liquid crystal panel 10 according to this embodiment includes the CF board 11 and the array board 12 that include the flexible resin substrates 11RS and 12RS, respectively. The strength of the resin substrates 11RS and 12RS is not sufficient for forming the films 20 to 22 and 23 to 29 in layers on the resin substrates 11RS and 12RS, respectively. Therefore, the method of producing the liquid crystal panel 10 according to this embodiment includes using supporting substrates 30 and 31 having higher strength. The resin substrates 11RS and 12RS are formed on the supporting substrates 30 and 31 via separation films 32 and 33. The films 20 to 22 and 23 to 29 are formed on the resin substrates 11RS and 12RS that are formed on the supporting substrates 30 and 31 via the separation films 32 and 33 and then the resin substrates 11RS and 12RS are removed from the supporting substrates 30 and 31. Because the resin substrates 11RS and 12RS are supported with the supporting substrates 30 and 31, sufficient strength is added to the resin substrates 11RS and 12RS. Therefore, the thin film components (including the TFTs 18 and the color filters 20) formed from the films 20 to 22 and 23 to 29 can be formed on the resin substrates 11RS and 12RS with sufficiently high accuracy.

Specifically, the method of producing the liquid crystal panel 10 according to this embodiment includes a separation film forming process, a resin substrate forming process (a component support forming process), a thin film component forming process, a bonding process, a light applying process, a determining process, and a removing process. Through the separation film forming process, the separation films 32 and 33 are formed on the supporting substrates 30 and 31, respectively. Through the resin substrate forming process, the resin substrates 11RS and 12RS are formed on the separation films 32 and 33, respectively. Through the thin film component forming process, the thin film components including the TFTs 18 and the color filters 20 are formed on the resin substrates 11RS and 12RS. Through the bonding process, the CF board 11 and the array board 12 are bonded. In the light applying process, light is applied to the separation films 32 and 33 for accelerating the removal of the resin substrates 11RS and 12RS. In the determining process, whether degrees of adhesion between a separation film 32 and the resin, substrate 11RS and between the separation film 33 and the resin substrate 12RS are high or low based on image data obtained through capturing of images of the separation films 32 and 33 from the resin substrate 11RS side and the resin substrate 12RS side. Through the removing process, the resin substrates 11RS and 12RS are removed from the supporting substrates 30 and 31, respectively if the degrees of the adhesion are determined low in the determining process.

A method of producing the CF board 11 includes a separation film forming process, a resin substrate forming process, a thin film component forming process, a light applying process, a determining process, and a removing process. Through the separation film forming process, the separation film 32 is formed on a supporting substrate 30. Through the resin substrate forming process, the resin substrate 11RS is formed on the separation film 32. Through the thin film component forming process, the thin film components including the color filters 20 are formed on the resin substrate 11RS. In the light applying process, light is applied to the separation film 32 for accelerating the removal of the resin substrate 11RS. In the determining process, whether a degree of adhesion between the separation film 32 and the resin substrate 11RS is high or low based on image data obtained through capturing images of the separation film 32 from the resin substrate 11RS side. Through the removing process, the resin substrate 11RS is removed from, the supporting substrate 30 if the degree of the adhesion is determined low in the determining process. A method of producing the array board 12 includes a separation film forming process, a resin substrate forming process, a thin film component forming process, a light applying process, a determining process, and a removing process. Through the separation film, forming process, the separation film 33 is formed on the supporting substrate 31. Through the resin substrate forming process, the resin substrate 12RS is formed on the separation film 33. Through the thin film component forming process, the thin film components including the TFTs 18 are formed on the res is substrate 12RS. In the light applying process, light is applied to the separation film 33 for accelerating the removal of the resin substrate 12RS. In the determining process, whether a degree of adhesion between the separation film 33 and the resin substrate 12RS is high or low based on image data obtained through capturing of images of the separation film 33 from the resin substrate 12RS side. Through the removing process, the resin substrate 12RS are removed from the supporting substrate 31 if the degree of the adhesion is determined low in the determining process.

Figure 3:
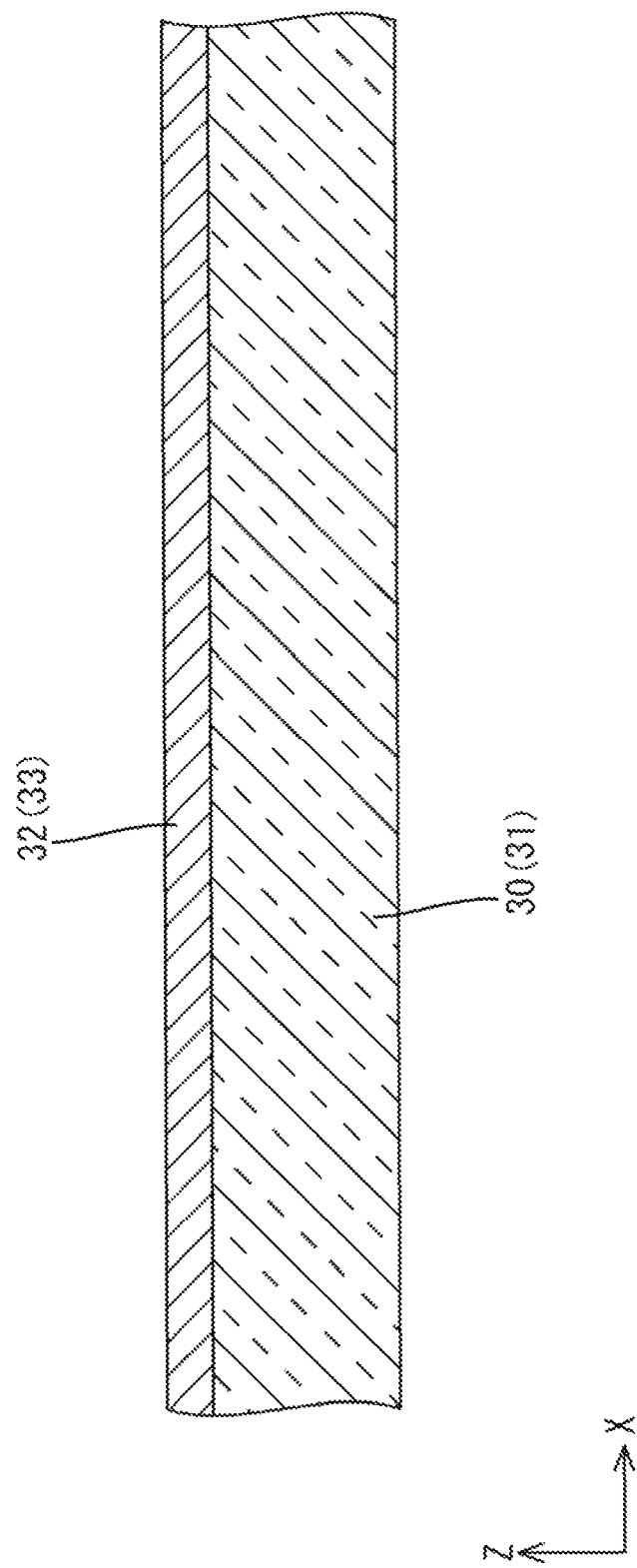
FIG. 3 is a cross-sectional view illustrating a condition in a production of the liquid crystal panel in which a separation film is formed on a supporting substrate.

Next, the processes will be described in sequence. As illustrated in FIG. 3, in the separation film forming processes, the separation films 32 and 33 made of metal are formed on the supporting substrates 30 and 31, respectively. The supporting substrates 30 and 31 are made of glass and have sufficient strength. An aluminosilicate glass that does not contain an alkaline component (non-alkaline glass) may be preferable for the material of the supporting substrates 30 and 31. A refractory metal such as molybdenum (Mo) may be preferable for the metal of the separation films 32 and 33. The "refractory metal" refers to a metal with a melting point of 1200° C. or higher, which is sufficiently higher than at least a decomposition temperature (about 500° C) of the synthetic resin (polyimide), that is, the material of the resin substrates 11RS and 12RS. The molybdenum used for the separation films 32 and 33 is a low light reflective material having low light reflectivity. The molybdenum has a property for absorbing light and efficiently converting the light into heat. It is preferable to set thicknesses of the separation films 32 and 33 made of molybdenum to 150 µm or larger. According to the configuration, the separations films 32 and 33 exhibit sufficient levels of light blocking effects and thus the light produced in the light applying process hardly passes through the separation films 32 and 33. Spattering or vapor deposition may be used for the formation of the separation films 32 and 33.

Figure 4:
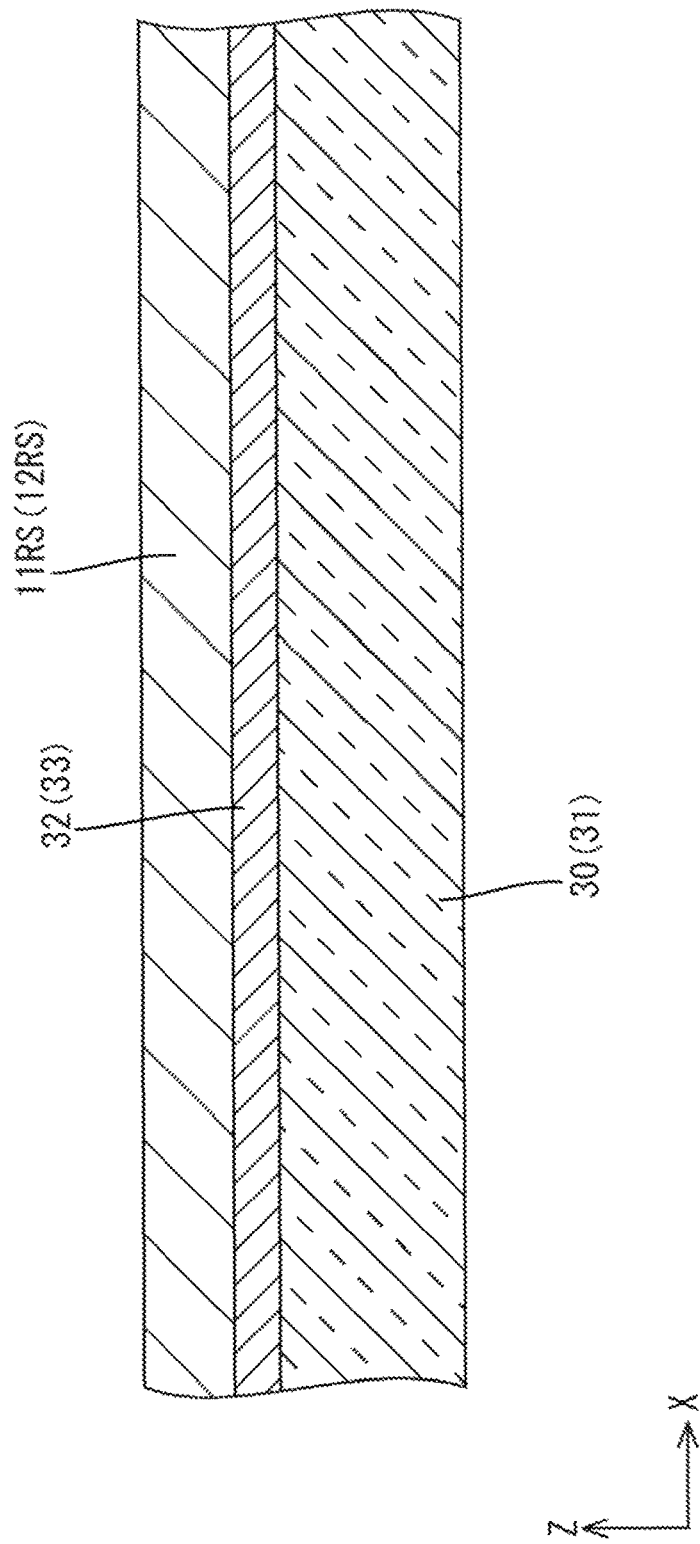
FIG. 4 is a cross-sectional view illustrating a condition in the production of the liquid crystal panel in which a resin substrate is formed on the separation film.

As illustrated in FIG. 4, in the resin substrate forming processes, a polyamide acid agent is evenly applied to surfaces of the separation films 32 and 33 by slit coating or spin coating and then baking is performed to accelerate imidization. Through this process, the resin substrates 11RS and 12RS made of polyimide are formed. The backing is performed at a temperature 180° C. or higher to accelerate the imidization of the polyamide acid agent. FIGS. 3 and 4 collectively illustrate the separation film forming process and the resin substrate forming process regarding the CF board 11 and the separation film forming process and the resin substrate forming process regarding the array board 12. The reference numerals regarding the array board 12 are enclosed in parentheses.

Figure 5:
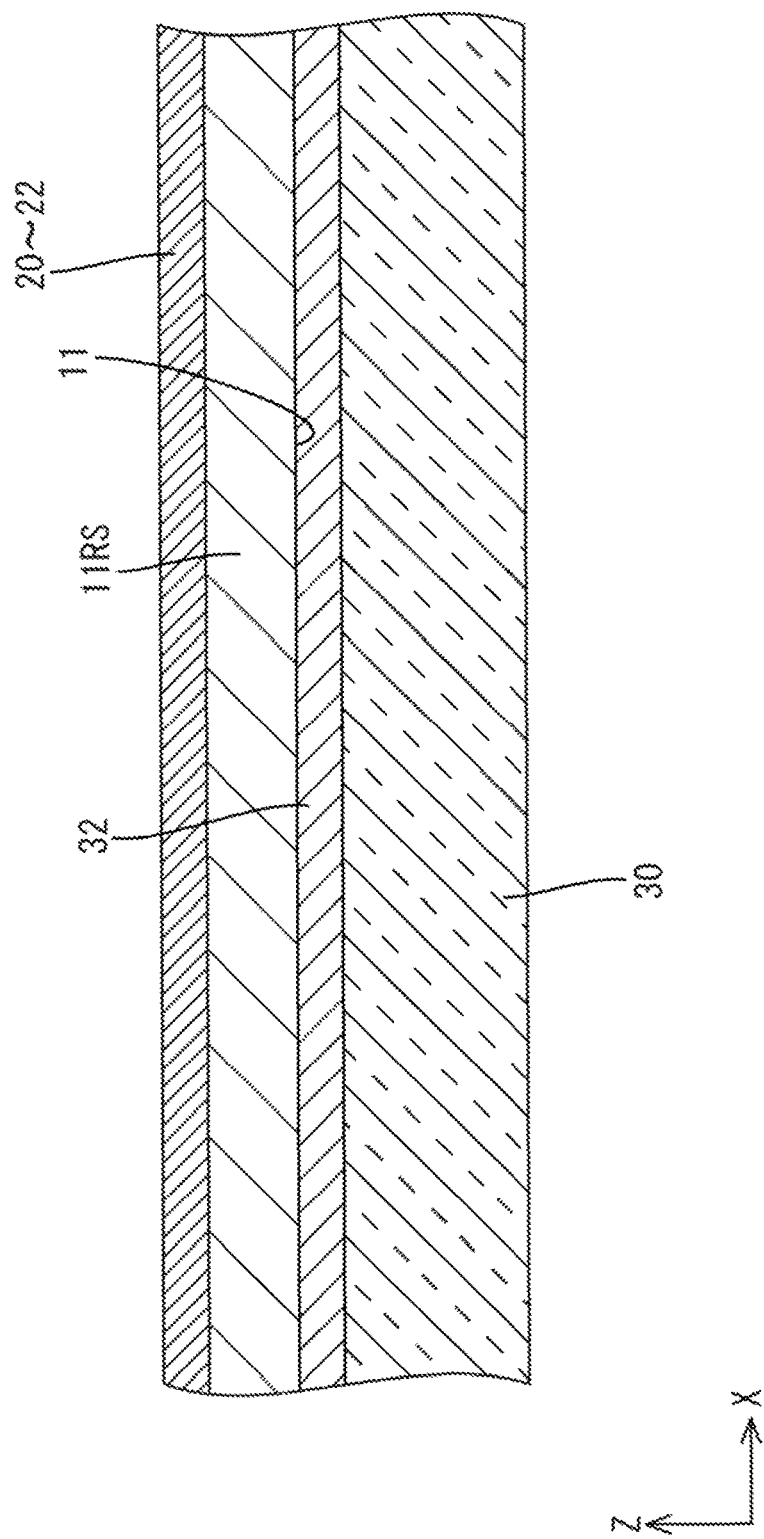
FIG. 5 is a cross-sectional view illustrating a condition in the production of the liquid crystal panel in which various kinds of films that form TFTs or other components on the resin substrate included in the array board.
Figure 6:
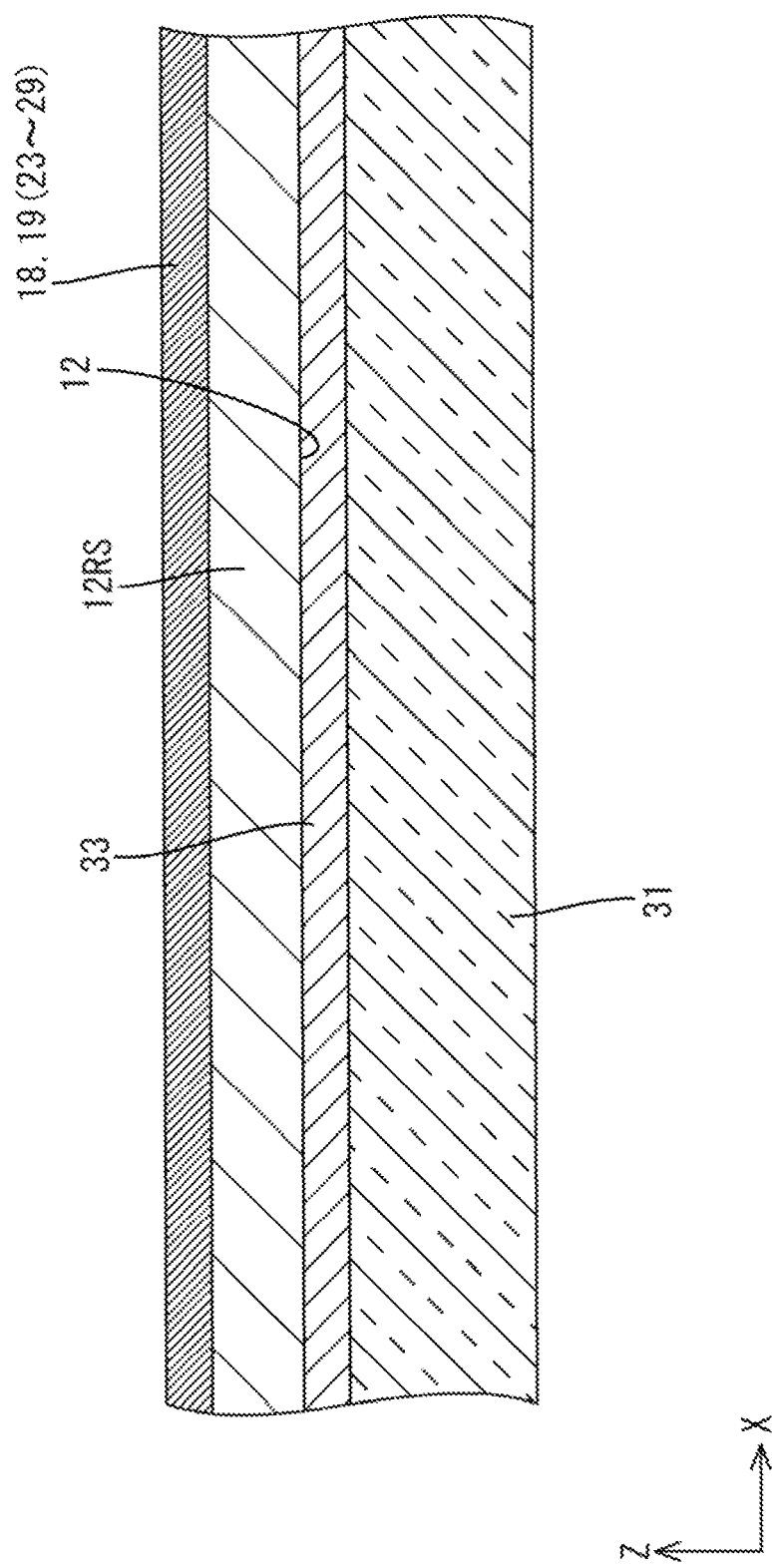
FIG. 6 is a cross-sectional view illustrating a condition in the production of the liquid crystal panel in which various kinds of films that form color filters and other components on the resin substrate included in the array board.
Figure 7:
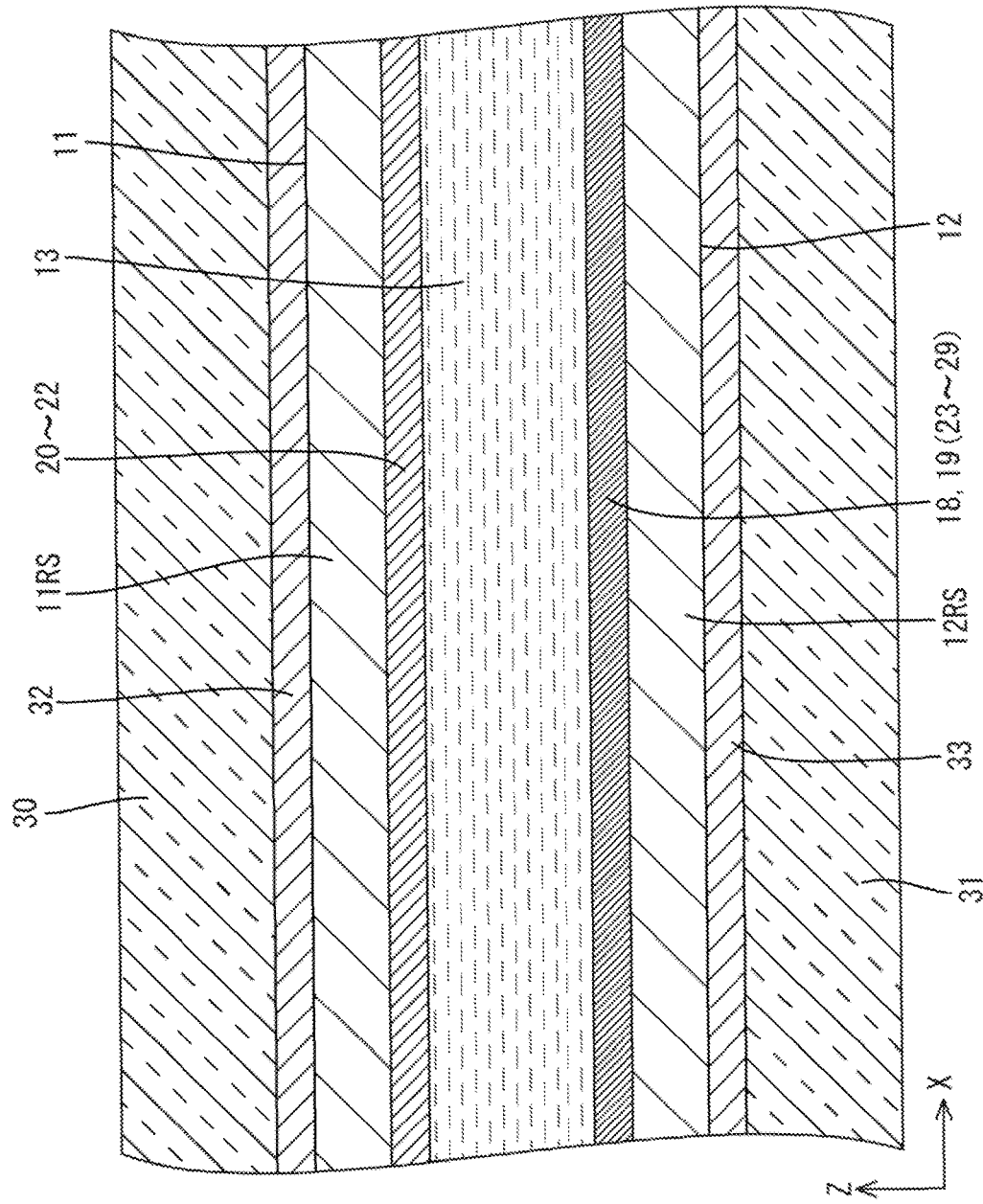
FIG. 7 is a cross-sectional view illustrating a condition in the production of the liquid crystal panel in which a CF board and the array board are bonded together and a liquid crystal layer is formed between the CF board and the array board.

As illustrated in FIGS. 5 and 6, in the thin film component forming process, the films 20 to 22 and 23 to 29 are formed on the surfaces of the respective resin substrates 11RS and 12RS and patterned in sequence using a known photolithography technology. Through this process, the thin film components (including the TFTs 18 and the color filters 20) are formed. The resin substrates 11RS and 12RS are supported with the supporting substrates 30 and 31 and thus the resin substrates 11RS and 12RS have the sufficient levels of strength. Therefore, the films 20 to 22 and 23 to 29 are formed and patterned with sufficiently high accuracy. FIGS. 5 and 6 do not illustrate details of the films 20 to 22 and 23 to 29. Please see FIGS. 1 and 2 for the details of the films 20 to 22 and 23 to 29.

In the bonding process, a sealing portion (not illustrated) is formed in a frame shape in the outer edge portion of the CF board 11 by drawing with a sealant dispenser and then the liquid crystals that are components of the liquid crystal layer 13 are dropped onto the CF board 11 and the array board 12 is placed opposed to the CF board 11 and bonded to the CF board 11. When the boards 11 and 12 are bonded together, a space between the boards 11 and 12 is filled with the liquid crystals and the liquid crystal layer 13 is formed. After the space is filled with the sufficient amount of the liquid crystals, the sealing portion is hardened and the liquid crystal layer 13 is sealed.

Figure 8:
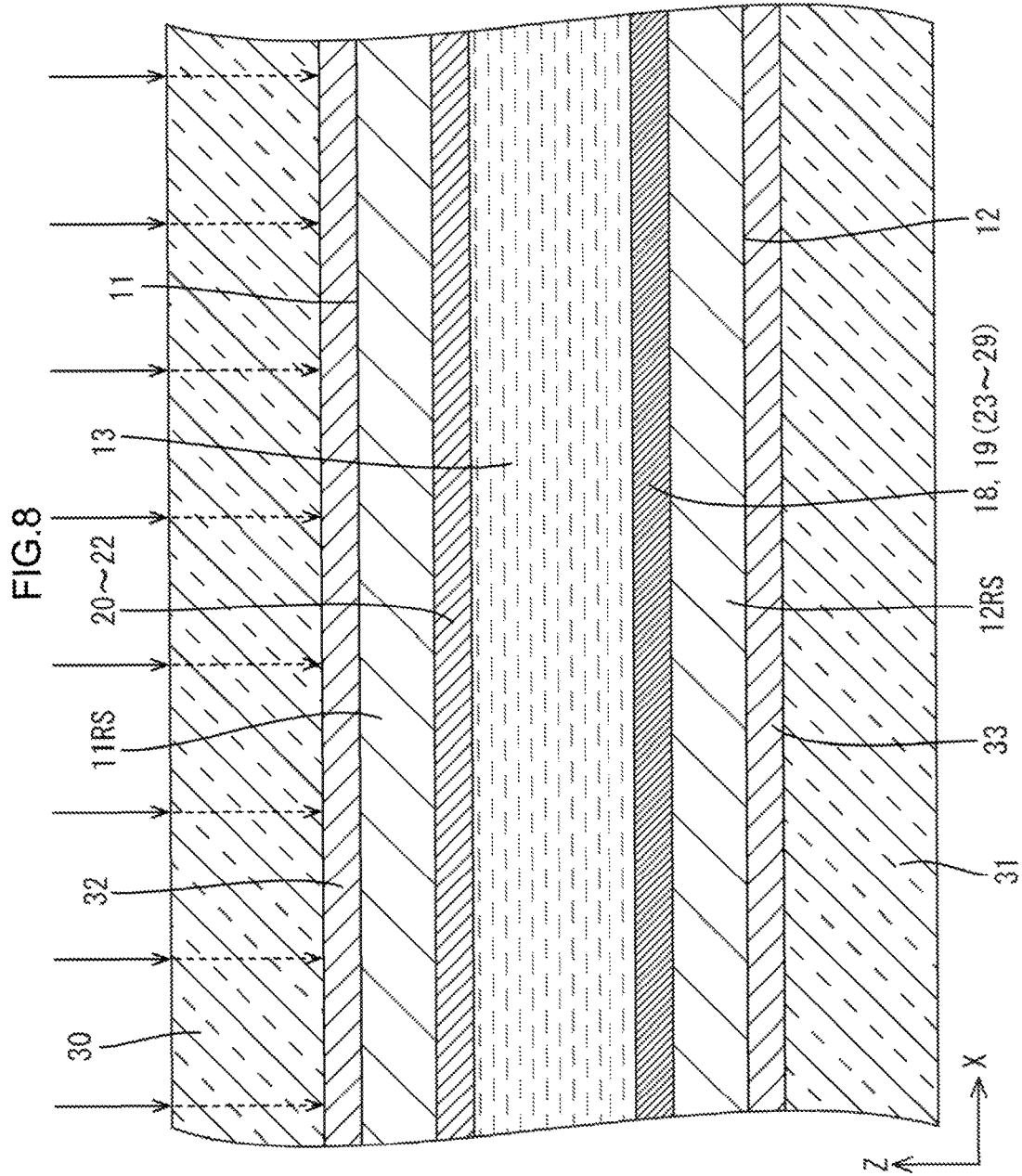
FIG. 8 is a cross-sectional view illustrating a condition in the production of the liquid crystal panel in which laser beams are applied through a supporting substrate that supports the CF board.

The light applying process, the determination process, and the removing process for the array board 12 are performed subsequently the processes for the CF board 11 or the other way around. In this embodiment, the processes for the CF board 11 are performed first. As illustrated in FIG. 8, in the light applying process for the CF board 11, the supporting substrate 30 for supporting the resin substrate 11RS of the CF board 11 is oriented to face the front side and laser beams, that is, light is applied from the front side to the separation film 32. Most of the laser beams that have reached the separation film 32 after passing through the substantially transparent supporting substrate 30 are absorbed by the separation film 32 and converted into heat. With the laser beams, the temperatures of portions of the separation film 32 to which the laser beams are applied reach high temperatures (600° C. or higher). As a result, melting may occur at an interface between the resin substrate 11RS and the separation film 32. The portions of the separation film 32 to which the laser beams are applied may be removed from the resin substrate 11RS due to a mechanical factor such as a thermal expansion difference. The separation film 32 to which the laser beams are applied is made of molybdenum and having the thickness of 150 nm or larger. Therefore, the laser beams are properly blocked and thus the laser beams are less likely to be directly applied to the thin film components including the color filters 20 and the performances of the thin film components are less likely to be reduced. In FIG. 8, the laser beams are indicated with solid-line arrows or broken-line arrows.

In the light applying process, the laser beams applied to the separation film 32 are produced by a solid-state laser including an yttrium vanadate crystal (YVO4) as a laser medium. It is preferable that wavelength of the laser beams is in a range that the laser beams are transmitted through the glass and absorbed by the polyimide of the resin substrates 11RS and 12RS (e.g., 355 nm). The laser beams produced by the solid-state laser are applied to scan a surface of the separation film 32 using the galvano cancer. The laser beams are intermittently applied to portions of the surface of the separation film 32 away from one another every short period of time. In this embodiment, the laser beams with a beam diameter of 50 µm and an energy level of 10 to 100 µJ are applied at 10 to 30 µm intervals every 1 to 20 µsec.

In the light applying process, if an output level of the laser oscillator (a light emitting device) which produces laser beams is lower than a predefined level or variations are observed in the portions of the separation film 32 to which the laser beams are applied, a degree of adhesion between the separation film 32 and the resin substrate 11RS may not sufficiently decrease. The removal of the resin substrate 11RS may not be smoothly performed in the removing process. This may result in defects in the resin substrate 11RS or the color filters 20 that are the thin film components. If the output level of the laser oscillator is higher than the predefined level, the degree of adhesion between the separation film 32 and the resin substrate 11RS may decrease more than expected. This may result in unexpected removal of the resin substrate 11RS and deformation or displacement of the resin substrate 11RS may occur. Therefore, the removal of the resin substrate 11RS in the removing process may become difficult. In this embodiment, the determination process is performed after the light applying process to determine whether the degree of adhesion between the separation film 32 and the resin substrate 11RS is high or low. In the determining process, an image of the separation film 32 on the supporting substrate 30 for supporting the resin substrate 11RS of the CF board 11 is captured after the light applying process and an image thresholding is performed. A highly attached portion 34 having a high degree of adhesion (see FIG. 12) is extracted and an occupancy rate of an area of the highly attached portion 34 over a total area of the separation film 32 is determined. Then, whether the degree of adhesion is high or low is determined based on whether or not the occupancy rate is higher than a threshold. Specifically, in the determining process, an image of the separation film 32 on the supporting substrate for supporting the resin substrate 11RS of the CF board 11 on the supporting substrate 30 side, that is, the light applying side is captured with an image capturing device such as a CCD camera. In the capturing of the image, a whole separation film 32 is not captured but in-plane portions of the separation film 32 (e.g., a total of five portions including a center portion of the surface of the separation film 32 and four corners) are separately captured to obtain image data including multiple images (e.g., five images). This is preferable in terms of reduction of takt time. An example of the captured images is on the left side in FIG. 12. Through image thresholding, processed images are obtained. An example of the processed images is on the right side in FIG. 12. In the images before the image thresholding and the images after the image thresholding, black portions are the highly attached portions 34. The highly attached portions 34 are more properly extractable from the processed images. The reasons why the highly attached portions 34 look black may be because the surface of the separation film 32 alters due to the application of the laser beams and the way of reflection of light at the surface alters.

After the highly attached portions 34 are extracted, the occupancy rate of the highly attached portions 34 is calculated. If the calculated occupancy rate of the highly attached portions 34 does not exceed 2.9% or 1.8% that is the first threshold in this embodiment, it is determined that the degree of adhesion between the separation film 32 and the resin substrate 11RS is sufficiently low. If the calculated occupancy rate exceeds 2.9% or 1.8%, it is determined that the degree of adhesion is too high. If the occupancy rate of the highly attached portions 34 is higher than 2.9%, the degree of adhesion between the separation film 32 and the resin substrate 11RS is too high. Therefore, an excessive force is required for removing the resin substrate 11RS in the removing process. This is more likely to cause damage or defect in the resin substrate 11RS. If the occupancy rate of the highly attached portions 34 is lower than 2.9% but higher than 1.8%, the color filters 20 that are the thin film components are more likely to have defects caused by stress on the resin substrate 11RS during removal of the resin substrate 11RS in the removing process. With the first threshold for the occupancy rate of the highly attached portions 34 set to 2.9%, a condition that the damage or the defect is more likely to occur in the resin substrate 11RS because the degree of adhesion between the separation film 32 and the resin substrate 11RS is too high is properly detectable. With the first threshold for the occupancy rate of the highly attached portions 34 set to 1.8%, not only a condition that the damage or the defect is more likely to occur in the resin substrate 11RS because the degree of adhesion between the separation film 32 and the resin substrate 11RS is too high is properly detectable but also the color filters 20 that are the thin film components are less likely to have the defects. This is further preferable for improving the yield. If the occupancy rate of the highly attached portions 34 is higher 2.9% or 1.8% that is the first threshold, the production may be stopped to improve the light applying process or the light applying process may be performed to reapply light to the separation film 32, the degree of adhesion of which is determined high. Namely, the removing process is not continued if the application of the light performed in the light applying process is not proper and thus the defects are less likely to occur in the resin substrate 11RS or the color filters 20 that are the thin film components. This improves the yield.

In the determining process, if the occupancy rate of the highly attached portions 34 calculated, based on the images processed through the image thresholding is not higher than 0.85% that is a second threshold, it is determined that the degree of adhesion is too low. If the occupancy rate is higher than 0.85%, the degree of adhesion between the separation film 32 and the resin substrate 11RS is properly low but not too low. If the occupancy rate of the highly attached portions 34 is not higher than 0.85%, the degree of adhesion between the separation film 32 and the resin substrate 11RS is too low. Therefore, the resin substrate 11RS may be unexpectedly removed from the supporting substrate 30 and thus deformation or displacement of the resin substrate 11RS is more likely to occur. This may cause difficulty in removal of the resin substrate 11RS in the removing process. With the second threshold for the occupancy rate of the highly attached portions 34 set to 0.85%, a condition that the resin substrate 11RS is more likely to be unexpectedly removed because the degree of adhesion between the separation film 32 and the resin substrate 11RS is too low is properly detectable. If the occupancy rate of the highly attached portions 34 is not higher than 0.85% that is the first threshold, the production may be stopped to improve the light applying process. Namely, the removing process is not continued if the application, of light performed in the light applying process is not proper and thus the resin substrate 11RS or the color filters 20 that are the thin film components are less likely to have the defects. This improves the yield.

Figure 9:
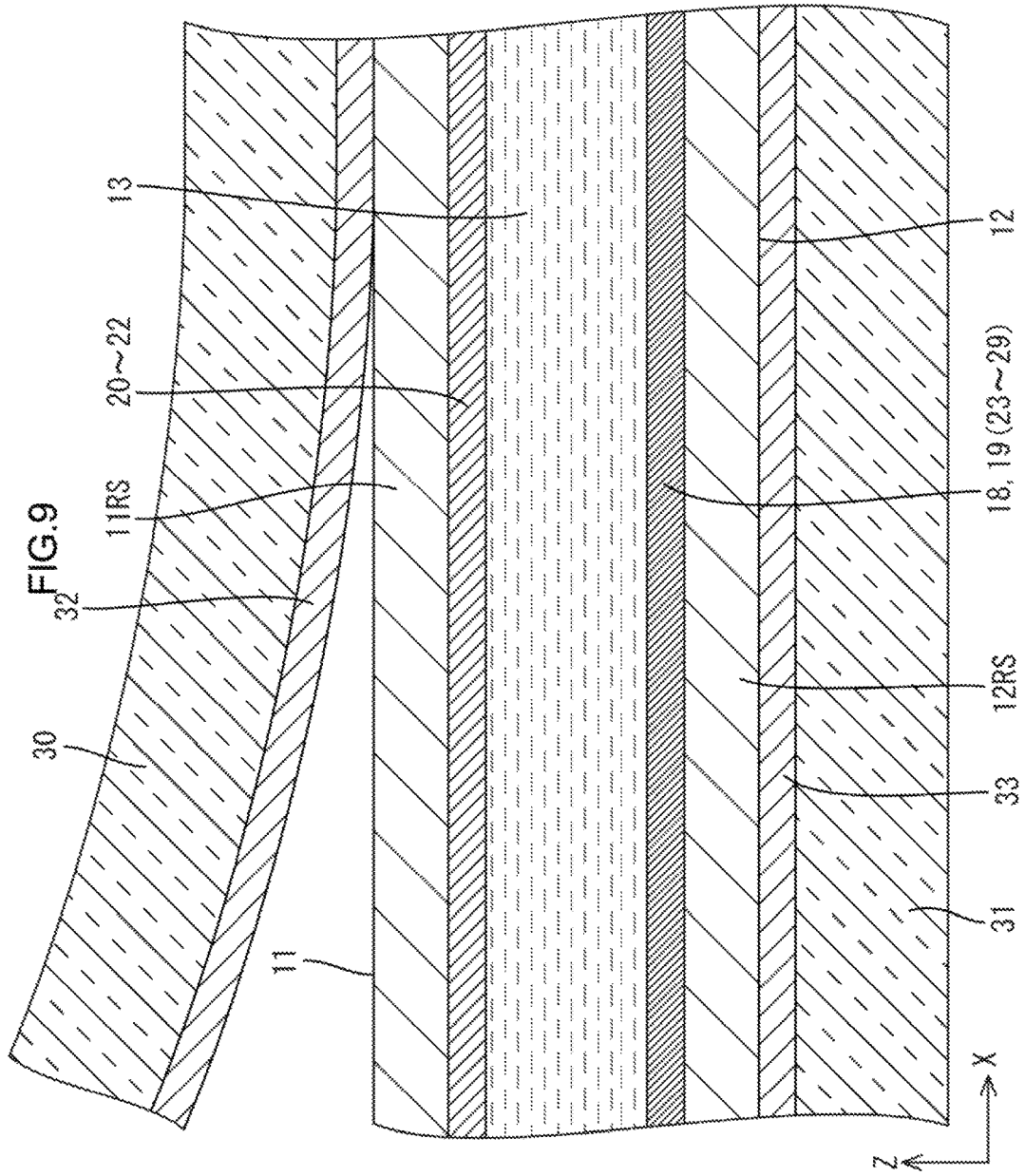
FIG. 9 is a cross-sectional view illustrating removal of the supporting substrate and the separation film on the CF board side from the CF board in the production of the liquid crystal panel.

In the determining process, if the occupancy rate of the highly attached portions 34 is equal to or lower than 2.9% or 1.8% that is the first threshold and equal to or higher than 0.85% that is the second threshold, the degree of adhesion between the separation film 32 and the resin substrate 11RS is not too high or too low, that is, the occupancy rate is proper. Therefore, the production proceeds to the removing process. In the removing process, as illustrated in FIG. 9, the supporting substrate 30 is peeled off the CP board 11. The resin substrate 11RS is smoothly removed from the separation film 32 on the supporting substrate 30 and thus the resin substrate 11RS or the color filters 20 that are the thin film components are less likely damaged due to the removal. In the removing process, it is preferable that the supporting substrate 30 is fixed to a removing member such a roller, which is not illustrated, with an adhesive, and then moved. Alternatively, the supporting substrate 20 may be fixed to a removing member with vacuum and then moved.

Figure 10:
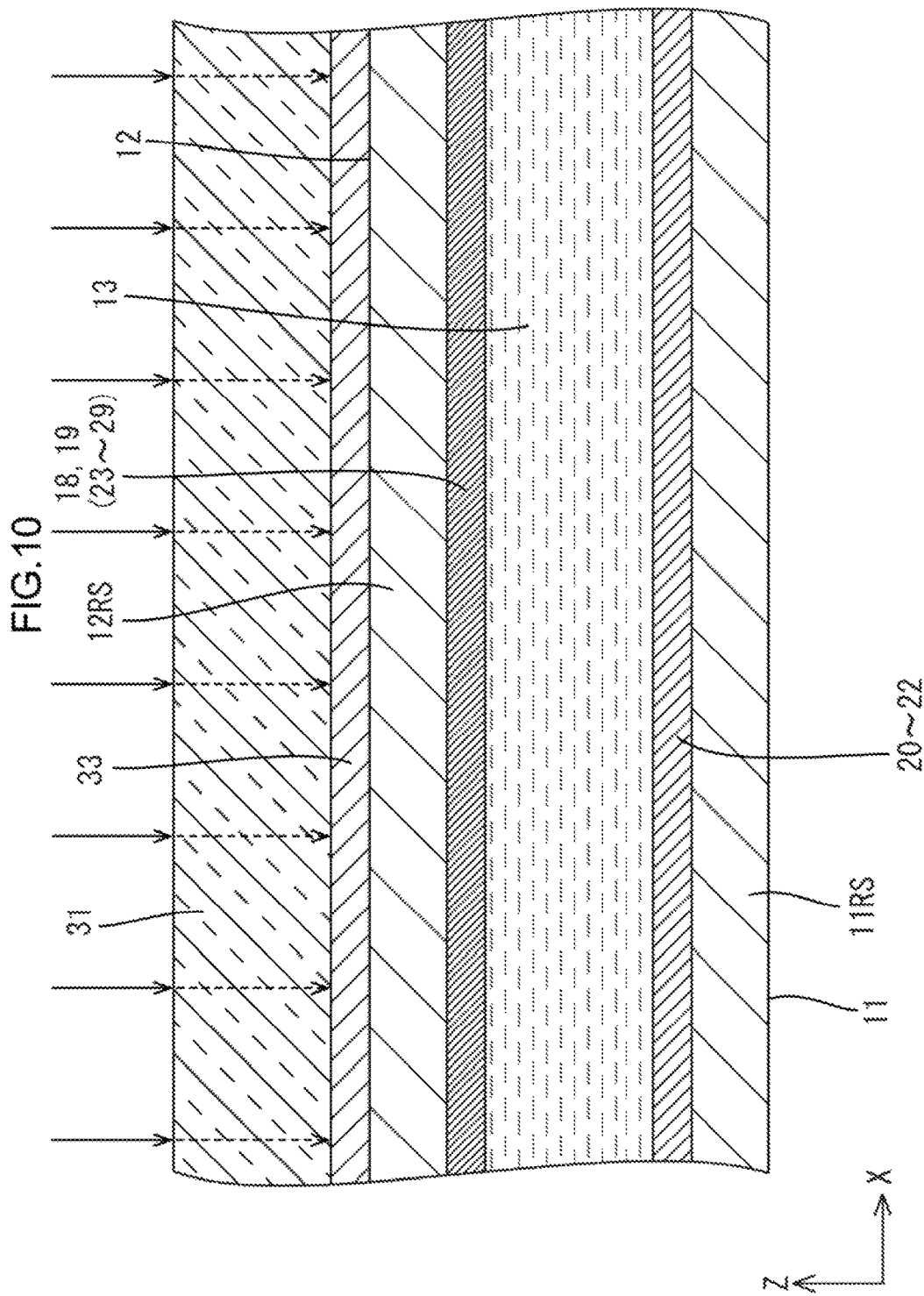
FIG. 10 is a cross-sectional view illustrating a condition in the production of the liquid crystal panel in which laser beams are applied through a supporting substrate that supports the array board.

After the light applying process, the determining process, and the removing process for the CF board 11 are completed, the light applying process, the determining process, and the removing process for the array board 12 are performed in sequence. As illustrated in FIG. 10, in the light applying process for the array board 12, the supporting substrate 31 for supporting the resin substrate 12RS of the array board 12 is oriented in a position to face the front side, and laser beams, that is, light is applied to the separation film 33. Most of the laser beams that have passed through the substantially transparent supporting substrate 31 and reached the separation film 33 are absorbed by the separation film 33 and converted into heat. With the laser beams, the temperatures of portions of the separation film 33 to which the laser beams are applied reach high temperatures (600° C. or higher). As a result, melting may occur at an interface between the resin substrate 12RS and the separation film 33. The portions of the separation film 33 to which the laser beams are applied may be removed from the resin substrate 12RS due to a mechanical factor such as a thermal expansion difference. Other steps of the light applying process for the array board 12 are similar to those of the light applying process for the CF board 11. In FIG. 10, the laser beams are indicated with solid-line arrows or broken-line arrows.

Figure 11:
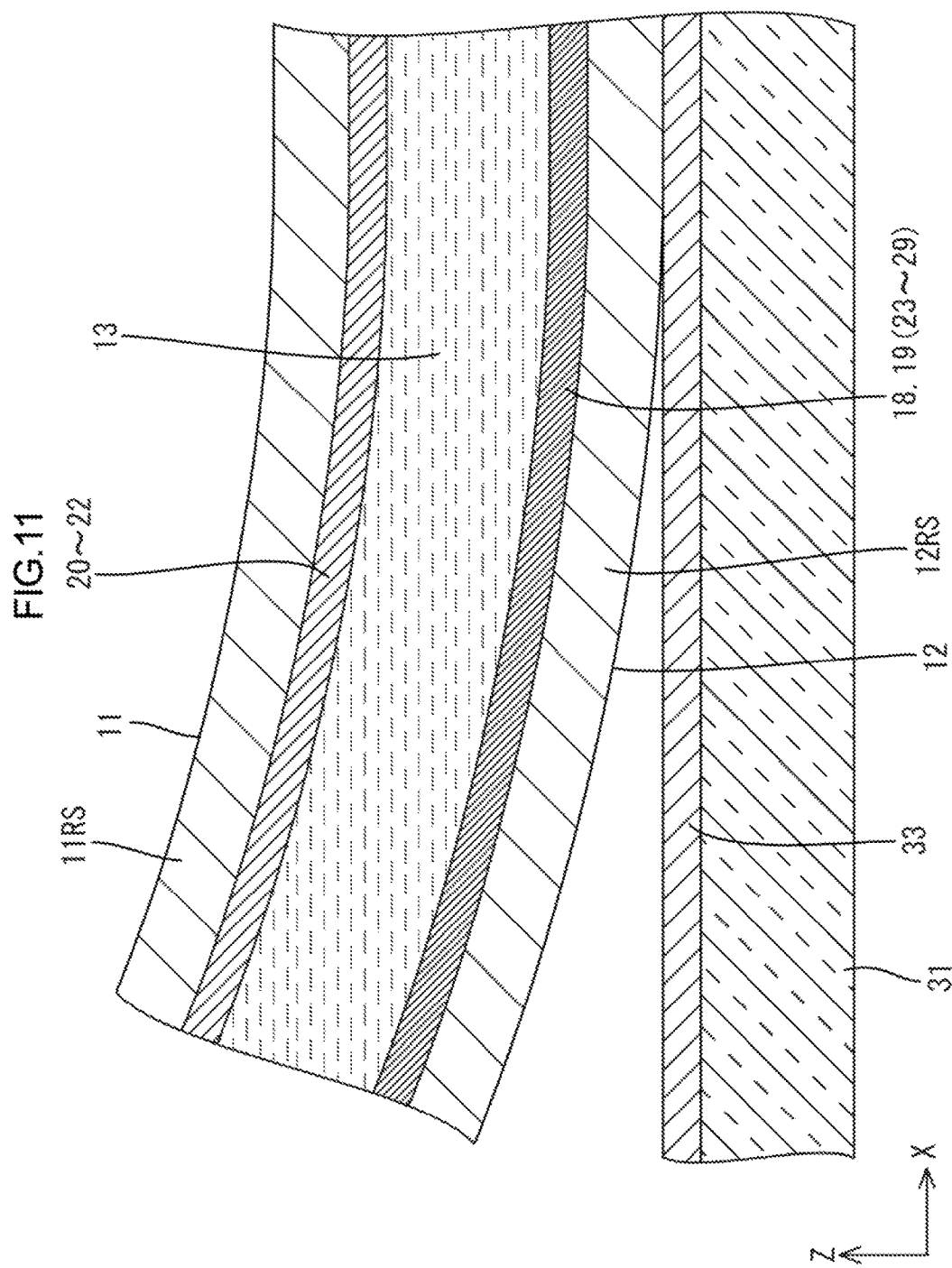
FIG. 11 is a cross-sectional view removal of the liquid crystal panel from the supporting substrate and the separation film on the array board side.
Figure 12:
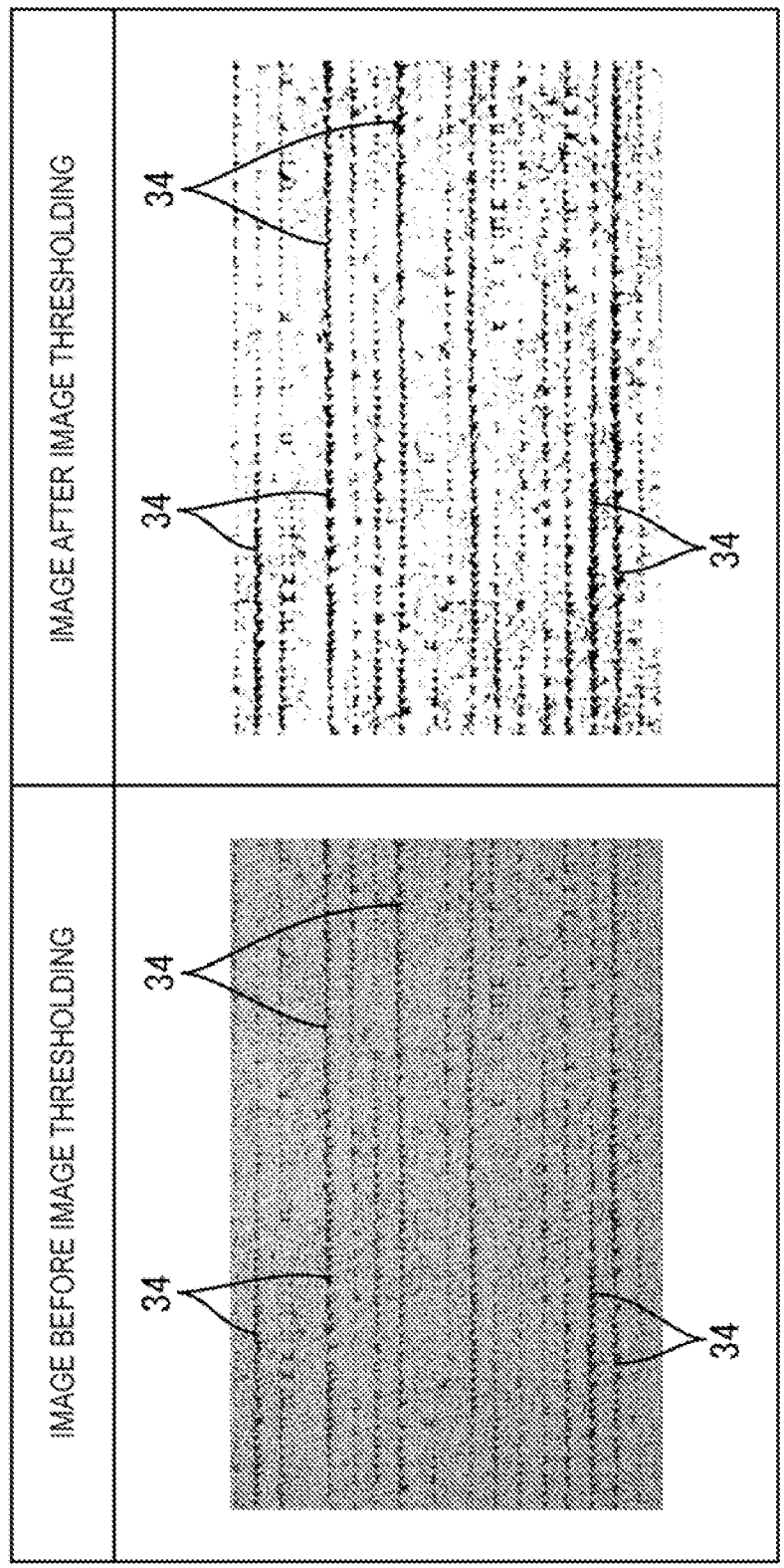
FIG. 12 is a view illustrating an image captured in the determining process and before image thresholding and an image captured in the determining process and after image thresholding.

In the determining process for the array board 12, images of the separation film 33 on the supporting substrate 31 for supporting the resin substrate 12RS after the light applying process are captured. The images are processed through image thresholding and highly attached portions 34 having high degrees of adhesion (see FIG. 12) are extracted. An occupancy rate that is a percentage of areas of the extracted highly attached portions 34 over a total area of the separation film 33 is determined. Whether the degree of adhesion is high or low is determined based on whether or not the occupancy rate is higher than a threshold. Regarding the threshold for the degree of adhesion between the separation film 33 and the resin substrate 12RS in the determining process for the array board 12, a first threshold is set to 2.9% or 1.8% and a second threshold is set to 0.85%, which is similar to the determining process for the CF board 11 described earlier. If the degree of adhesion does not satisfy a determination condition in the determining process for the array board 12 (if the occupancy rate is higher than the first threshold or lower than the second threshold), the production may be stopped to improve the light applying process. If the degree of adhesion is out of the determination condition (i.e., if the occupancy rate is equal to or lower than the first threshold and equal to or higher than the second threshold), the production proceeds to the removing process. As illustrated in FIG. 11, in the removing process for the array board 12, the CF board 11 and the array board 12 that are bonded together are removed from the supporting substrate 31. The resin substrate 12RS is smoothly removed from the separation film 33 on the supporting substrate 31 and thus the resin substrate 12RS and the TFTs 18 that are the thin film components are less likely to have defects due to the removal. As illustrated in FIG. 1, the polarizing plates 16 and 17 are attached to the resin substrates 11RS and 12RS removed from, the supporting substrates 30 and 31, respectively. Through the above processes, the liquid crystal panel 10 including the CF board 11 and the array board 12 that include the resin substrates 11RS and 12RS having flexibility, respectively, is produced.

Figure 13:
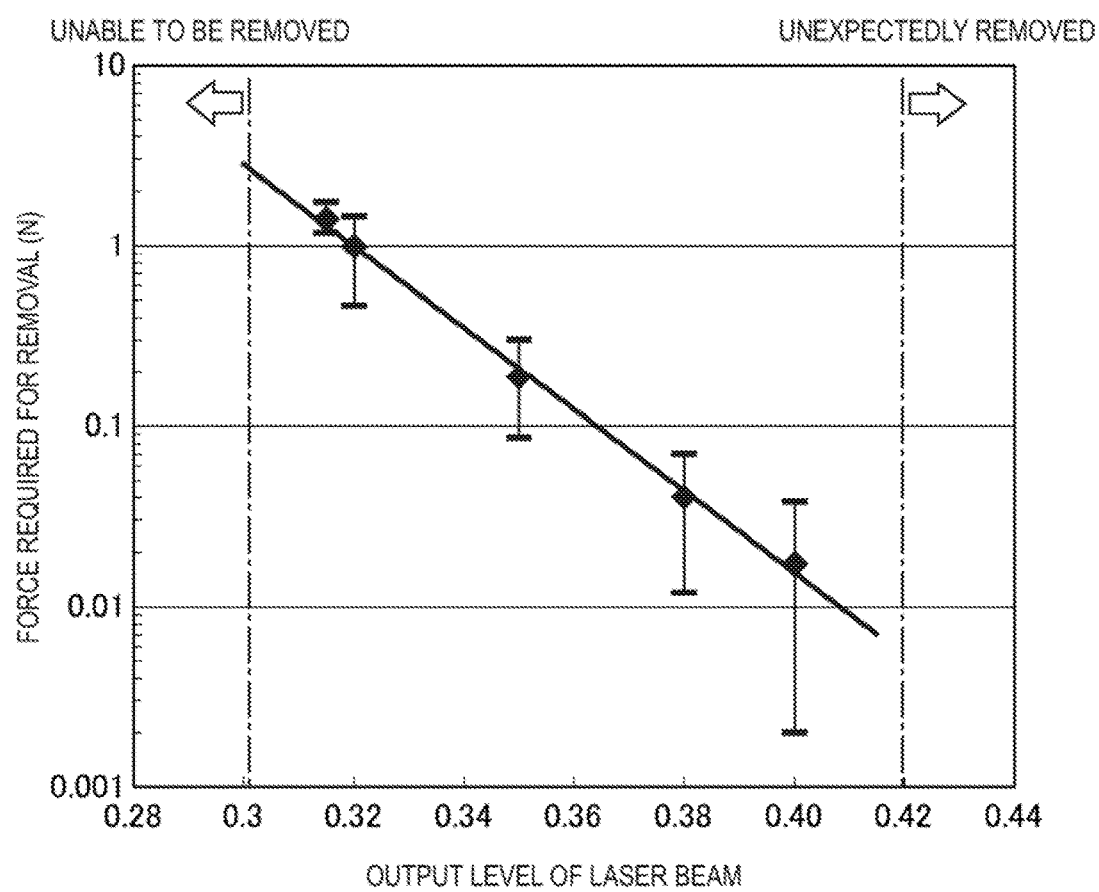
FIG. 13 is a graph illustrating a relationship between a force required for removal and an output level of laser beam in comparative experiment 1.

The following comparative experiment was conducted to observe how the forces that were required for the removals in the removing processes varied as output levels of the laser beams that were applied to the separation films 32 and 33 were altered in the light applying process among the processes of producing the boards 11 and 12. In comparative experiment 1, the output levels of the laser beams were expressed in relative values (no unit) with the maximum output of the laser oscillator as a reference. The forces required for the removals were expressed in N (newton). Measured forces required for the removals in the removing processes where the output levels of the laser beams were set to 0.315, 0.32, 0.35, 0.33, and 0.4 are provided in FIG. 13. The relative values of the output levels of the laser beams were set to 0.315, 0.32, 0.35, 0.38, and 0.4 correspond to absolute values 1.89 W, 1.92 W, 2.10 W, 2.28 and 2.40 W, respectively. FIG. 13 is a single logarithmic chart with the output levels of the laser beams on the horizontal axis and the forces required for the removals on the vertical axis that has logarithmic scales. In FIG. 13, five values corresponding to the output levels of the laser beams are plotted and an approximation, line obtained by a method of approximation such as a least square method is illustrated. Furthermore, measurement errors regarding the forces required for the removals are provided in the form of error bars. In comparative experiment 1, the laser oscillator (a light source) having a specific configuration was used. Therefore, the results of comparative experiment may differ from results of experiments using laser oscillators having different configuration (e.g., a different optical system, a different oscillator configuration) for emitting laser beams (laser beams of Gaussian beams) with different diameters of the laser beams. The results of the experiments using such laser oscillators may differ from the results in FIG. 13.

The results of comparative experiment 1 will be described. According to FIG. 13, the forces required for the removals relative to the output levels of the laser beams tend to be inversely proportional in exponential form. If the output level of the laser beams decreases even by a small amount, the force required for the removal greatly increases. If the output level of the laser beams increases even by a small amount, the force required for the removal greatly decreases. Therefore, the laser oscillator used in the light applying process needs to maintain the output level of the laser beams constant with significantly high accuracy. However, because a large number of laser oscillators are continuously produced and thus proper output levels of laser beams may not be obtained depending on production lots. If the proper output level of the laser beams is not obtained in the production, the production needs to be promptly stopped to adjust the output level of the laser beams to a proper value. This is important for improving the yield.

A relationship between the forces required for the removals and the output levels of the laser beams will be described in more detail. As illustrated in FIG. 13, if the forces required for the removals are larger than 3 N, the removals cannot be performed. If the relative values of the output levels of the laser beams are smaller than about 0.3 (the absolute value of 1.8 W), the resin substrates 11RS and 12RS are more likely to be damaged in the removing processes and the yield significantly decreases. If the forces required for the removals are larger than 0.1 N, the removals can be performed but the thin film components (e.g., the TFTs 18 and the color filters 20) on the resin substrates 11RS and 12RS are more likely to have defects, If the relative values of the output levels of the laser beams are smaller than 0.36 (the absolute value of 2.16 W), the thin film components are more likely to have the defects and thus the yield decreases. If the forces required for the removals are smaller than about 0.006 N, an expected removal tends to easily occur, for example, the resin substrates 11RS and 12RS may be easily removed due to internal stress of the thin film components. If the relative values of the output levels of the laser beams are larger than about 0.42 (the absolute value of 2.52 W), the removing device cannot properly hold the removing objects and thus the removals in the removing process become difficult. According to the results, it is preferable to set the relative values of the output levels of the laser beams in a range from 0.3 (the absolute value of 1.80 W) to 0.42 (the absolute value of 2.52 W). It is more preferable to set the relative values in a range from 0.36 (the absolute value of 2.16 W) to 0.42 (the absolute value of 21.52 W).

Figure 14:
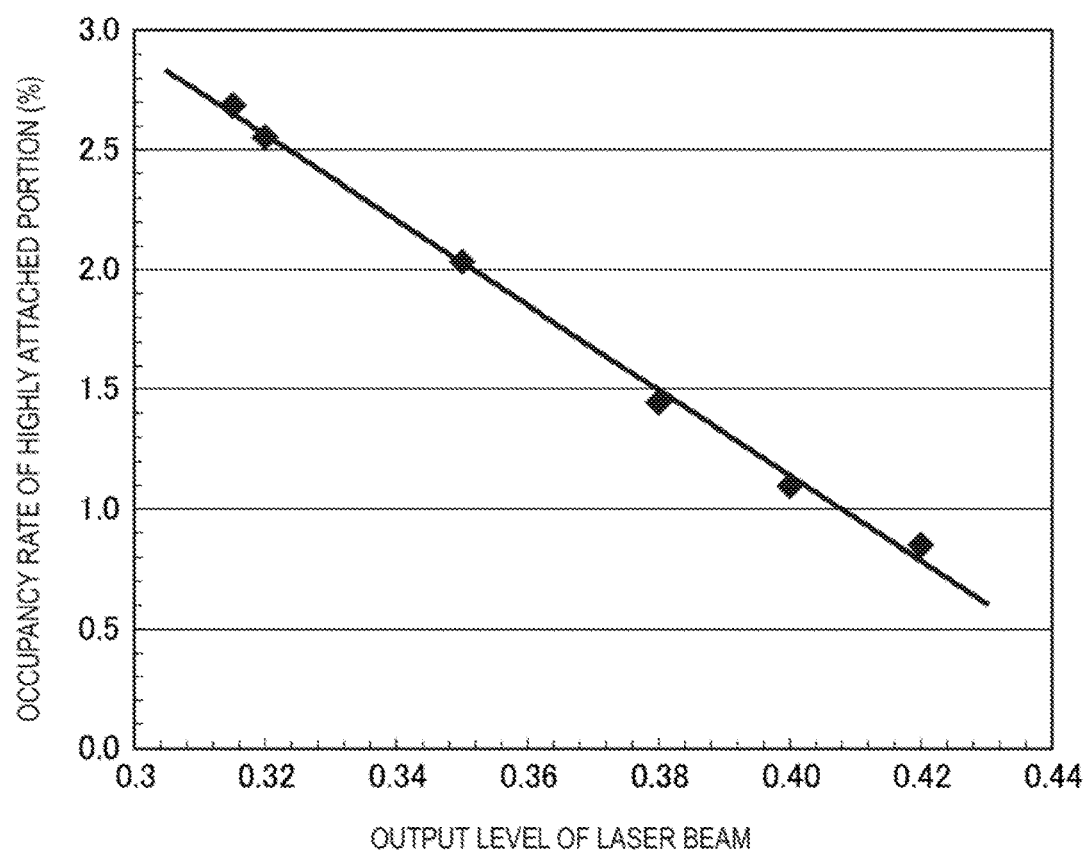
FIG. 14 is a graph illustrating a relationship between a force required for removal and an output level of laser beam in comparative experiment 1.

Next, the following comparative experiment 2 was conducted to observe how the occupancy rates of the highly attached portions 34 extracted from the images captured in the determining processes varied as the output levels of the laser beams applied to the separation films 32 and 33 were altered in the light applying processes. In comparative experiment 2, the output levels of the laser beams were expressed in relative values (no unit) with the maximum output of the laser oscillator as a reference. The occupancy rates were expressed in percentage (%). The occupancy rates of the highly attached portions 34 extracted from the images captured in the determining processes calculated where the output levels of the laser beams were set to, 0.315, 0.32, 0.35, 0,38, 0.4, and 0.42 are provided in FIG. 14, The relative values of the output levels of the laser beams were set to 0.315, 0.32, 0.35, 0.38, 0.4, and 0.42 correspond to absolute values 1.89 W, 1.92 W, 2.10 W, 2.28 W, 2.40 M, and 2.52 W, respectively. FIG. 14 includes the output levels of the laser beams on the horizontal, axis and the occupancy rates of the highly attached portions 34 on the vertical axis. In FIG. 14, six values corresponding to the output levels of the laser beams are plotted and an approximation line obtained by a method of approximation such as a least square method is illustrated. In comparative experiment 2, the laser oscillator (a light source) having a specific configuration was used. Therefore, the results of comparative experiment may differ from results of experiments using laser oscillators having different configuration (e.g., a different optical system, a different oscillator configuration) for emitting laser beams (laser beams of Gaussian beams) with different diameters of the laser beams. The results of the experiments using such laser oscillators may differ from the results in FIG. 14.

The results of comparative experiment will be described. According to FIG. 14, the occupancy rates of the highly attached portions 34 tend to be inversely proportional to the output levels of the laser beams. Namely, as the output levels of the laser beams decrease, the occupancy rates of the highly attached portions 34 increase. As the output levels of the laser beams increase, the occupancy rates of the highly attached portions 34 decrease. A relationship between the occupancy rates of the highly attached portions 34 and the output levels of the laser beams will be described in more detail. When the relative value of the laser output is 0.3 (the absolute value of 1.80 W), the occupancy rate of the highly attached portions 34 is about 2.9%. When the relative value of the laser output is 0.36 (the absolute value of 2.16 W), the occupancy rate of the highly attached portions 34 is about 1.8%. When the relative value of the laser output is 0.42 (the absolute value of 2.52), the occupancy rate of the highly attached portions 34 is about 0.85%.

Figure 15:
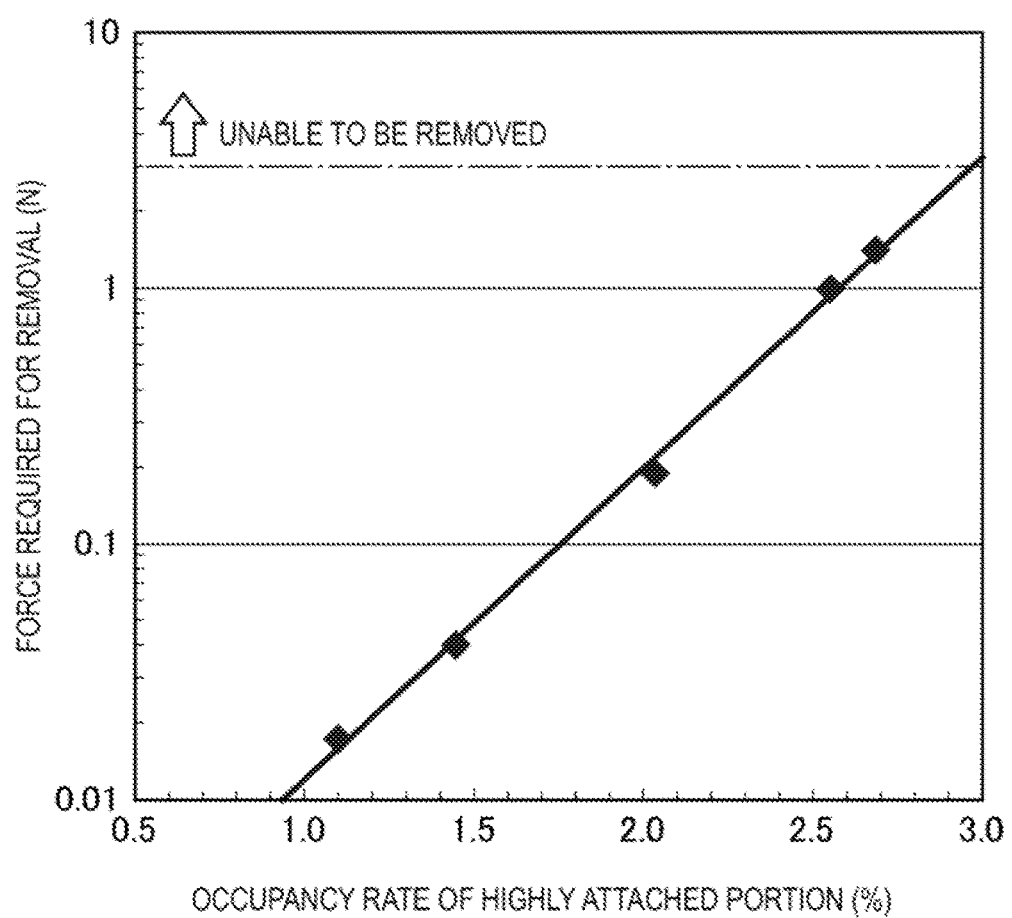
FIG. 15 is a graph illustrating a relationship between force required for removal and occupancy rate of highly attached portion in comparable experiments 1 and 2.

A relationship between the forces required for the removals and the occupancy rates of the highly attached portions 34 based on the results of comparative experiments 1 and 2 (FIGS. 13 and 14) described above is illustrated in FIG. 15. FIG. 15 is a chart produced by converting data on the output levels of the laser beams on the horizontal axis in FIG. 13 into data on the occupancy rates of the highly attached portions 34 on the vertical axis in FIG. 14. FIG. 15 is a single logarithmic chart with the occupancy rates of the highly attached portions 34 on the horizontal axis and the forces required for the removals. Only the vertical axis has logarithmic scales. According to FIG. 15, the forces required for the removals tend to be inversely proportional to the occupancy rates of the highly attached portions 34 in exponential form. If the occupancy rate of the highly attached portions 34 decreases even by a small amount, the force required for the removal greatly decreases. If the occupancy rate of the highly attached portions 34 increases even by a small amount, the force required for the removal greatly increases. More detailed explanation will be provided. If the forces required for the removals are larger than 3 N, the removals cannot be performed. If the occupancy rates of the highly attached portions 34 are higher than 2.9%, the resin substrates 11RS and 12RS are more likely to be damaged in the removing processes and the yield significantly decreases, if the forces required for the removals are larger than 0.1 N, the removals can be performed, but the thin film components (e.g., the TFTs 18 and the color filters 20) on the resin substrates 11RS and 12RS are more likely to have defects. If the occupancy rates of the highly attached portions 34 are higher than about 1.8%, the thin film components are more likely to have the defects and thus the yield decreases. If the forces required for the removals are smaller than about 0.006 an expected removal tends to easily occur, for example, the resin substrates 11RS and 12RS may be easily removed due to internal stress of the thin film components. If the occupancy rates of the highly attached portions 34 are lower than about 0.85%, the removing device cannot properly hold the removing objects and thus the removals become difficult in the removing process. According to the results, it is preferable to set the occupancy rates of the highly attached portions 34 in a range from 0.85% to 2.9%. It is more preferable to set the occupancy rates of the highly attached portions 34 in a range from 0.85% to 1.8%.

As described above, the method of producing the CF board 11 and the array board 12 (the component boards) according to this embodiment includes the separation film forming processes, the component support forming processes, the thin film component forming processes, the light applying processes, the determining processes, and the removing processes. In the separation film forming processes, the separation films 32 and 33 are formed on the supporting substrates 30 and 31, respectively. In the component support forming processes, the resin substrates 11RS and 12RS (the component supports) are formed on the separation films 32 and 33, respectively. In the thin film component forming processes, the TFTs 18 and the color filters 20 that are the thin film components are formed on the resin substrates 11RS and 12RS, respectively. In the light applying processes, the light is applied to the separation films 32 and 33, respectively, to accelerate the removals of the resin substrates 11RS and 12RS. In the determining processes, whether the degrees of adhesion between the separation film 32 and the resin substrate 11RS and between the separation film 33 and the resin substrate 12RS are high or low based on the image data obtained through capturing of images of the separation films 32 and 33. In the removing processes, the resin substrates 11RS and 12RS are removed from the supporting substrates 30 and 31, respectively, if the degrees of adhesion are determined low in the determining processes.

First, the separation films 32 and 33 are formed on the supporting substrates 30 and 31 through the separation film forming processes, respectively. Next, the resin substrates 11RS and 12RS are formed on the separation films 32 and 33 through the component support forming processes, respectively. Then, the TFTs 18 and the color filters 20 that are the thin film components are formed on the resin substrates 11RS and 12RS through the thin film component forming processes, respectively. The resin substrates 11RS and 12RS on which the TFTs 18 and the color filters 20 that are thin film components are formed are supported with the supporting substrates 30 and 31 via the separation films 32 and 33, respectively. Therefore, the resin substrates 11RS and 12RS have the sufficient strength and thus the TFTs 18 and the color filters 20 that are the thin film components are properly formed. In the light applying processes, the light is applied to the separation films 32 and 33 to accelerate the removals of the resin substrates 11RS and 12RS. If the sufficient level of the light is applied to the separation films 32 and 33 at the proper positions, the degrees of adhesion between the separation film 32 and the resin substrate 11RS and between the separation film 33 and the resin substrate 12RS (the degrees of adhesion resulting from the energy level of the applied light and the thermal factor) sufficiently decrease. Therefore, the removals of the resin substrates 11RS and 12RS in the removing processes performed after the light applying processes become easier. If the level of the light applied to the separation films 32 and 33 is not sufficient or the positions of the application of the light are not proper, the degrees of adhesion between the separation film 32 and the resin substrate 11RS and between the separation film 33 and the resin substrate 12RS do not sufficiently decrease. Therefore, the removals of the resin substrates 11RS and 12RS in the removing processes become difficult. If the removals of the resin substrates 11RS and 12RS are performed even though the degrees of adhesion between the separation film 32 and the resin substrate 11RS and between the separation film 33 and the resin substrate 12RS are high, the resin substrates 11RS and 12RS and the thin film components including the TFTs 18 and the color filters 20 may have the defects.

Therefore, in the determining processes performed after the light applying processes, whether the degrees of adhesion between the separation film 32 and the resin substrate 11RS and between the separation film 33 and the resin substrate 12RS are high or low are determined based on the image data obtained through capturing of images of the separation films 32 and 33. For example, if the degree of adhesion between the separation film 32 and the resin substrate 11RS or between the separation film 33 and the resin substrate 12RS (the degree of adhesion resulting from the energy level of the applied light and the thermal factor) is determined sufficiently low in the determining process, the resin substrate 11RS or 12RS can be easily removed from the supporting substrate 30 or 31 in the removing process performed after the determining process. If the degree of adhesion between the separation film 32 and the resin substrate 11RS or between the separation film 33 and the resin substrate 12RS (the degree of adhesion resulting from the energy level of the applied light and the thermal factor)

is determined high without sufficiently lowered, the application of the light in the light applying process is not proper. Therefore, the production may be stopped to improve the light applying process or to apply the light to the separation film 32 or 33, the degree of adhesion of which is determined high. The removing process is less likely to be performed if the application of light in the light applying process is not proper. Therefore, the resin substrates 11RS and 12RS are less likely to have the defects and thus the yield improves.

In the determining processes, the images are processed through the image thresholding and the highly attached portions 34 are extracted. Further in the determination processes, whether the degrees of adhesion are high or low are determined based on whether or not the occupancy rate of the highly attached portions 34 over the total area of the separation film 32 and the occupancy rate of the highly attached portions 34 over the total area of the separation film 33 are higher than the threshold or the areas of the highly attached portions 34 are larger than the threshold. In comparison to determining processes in which whether the degrees of adhesion are high or low are determined based on visual inspection of images by a person, criteria for the determination of the degrees of adhesion are clearer. Therefore, more accurate determination results can be obtained in the determining process and the takt time of the determining processes can be reduced. Furthermore, the degrees of adhesion can be calculated through image data and simple image processing and thus inline processing using an image capturing device such as a CCD camera is possible.

In the determining processes, the multiple in-plane portions of the separation films 32 and 33 are captured to obtain the image data including the multiple images and the highly attached portions 34 are extracted from the image data. Then, whether the degrees of adhesion are high or low are determined based on whether or not the occupancy rates of the extracted highly attached portions 34 are higher than the threshold or the areas of the extracted highly attached portions 34 are larger than the threshold. In comparison to determining processes in which the highly attached portions 34 are extracted from image data including images of the entire areas of the separation films 32 and 33, the takt time of the determining processes can be further reduced.

The threshold for the occupancy rates of the highly attached portions 34 in the determining processes is set to 2.9%. If the occupancy rates of the highly attached portions 34 are higher than 2.9%, the degrees of adhesion between the separation film 32 and the resin substrate 11RS and between the separation film 33 and the resin substrate 12RS are high. The excessive forces may be required fox the removals in the removing processes and thus the resin substrates 11RS and 12RS are more likely to have deficiencies such as damages. By setting the threshold for the occupancy rates of the highly attached portions 34 in the determining processes to 2.9%, conditions in which the degrees of adhesion between the separation film 32 and the resin substrate 11RS and between the separation film 33 and the resin substrate 12RS are high are properly detectable.

The threshold for the occupancy rates of the highly attached portions 34 inn the determining processes is set to 1.8%. If the occupancy rates of the highly attached portions 34 are higher than 2.9%, the degrees of adhesion between the separation film 32 and the resin substrate 11RS and between the separation film 33 and the resin substrate 12RS are high. The excessive forces may be required for the removals in the removing processes and thus the resin substrates 11RS and 12RS are more likely to have deficiencies such as damages, furthermore, if the occupancy rates of the highly attached portions 34 are lower than 2.9% but higher than 1.8%, the thin film components such as the TFTs 18 and the color filters 20 are more likely to have defects caused by stress on the resin substrate 11RS and 12RS during removals of the resin substrates 11RS and 12RS in the removing processes. With the threshold for the occupancy rates of the highly attached-portions 34 in the determining processes set to 1.8%, conditions in which the degrees of adhesion between the separation film 32 and the resin substrate 11RS and between the separation film 33 and the resin substrate 12RS are high are highly detectable and thus the thin film components such as the TFTs 18 and the color filters 20 are less likely to have the defects. This is further preferable for improving the yield.

In the determining processes, whether or not the degrees of adhesion are too low is determined based on whether or not the occupancy rates of the highly attached portions 34 are higher than the second threshold that is smaller than the threshold or the areas of the highly attached portions 34 are smaller than the second threshold that is smaller than the threshold. If the degrees of adhesion between the separation film 32 and the resin substrate 11RS and between the separation film 33 and the resin substrate 12RS are too low, the resin substrates 11RS or 12RS may be unexpectedly removed from the supporting substrates 30 or 31. Therefore, the deformation or the displacement of the resin substrates 11RS and 12RS are more likely to occur and thus the removals of the resin substrates 11RS and 12RS in the removing processes may become difficult. In the determining processes, if the occupancy rates of the highly attached portions 34 are higher than the second threshold or the areas of the highly attached portions 34 are larger than the second threshold, the degrees of adhesion are determined properly low but not too low. If the occupancy rates of the highly attached portions 34 are lower than the second threshold or the areas of the highly attached portions 34 are larger than the second threshold, the degrees of adhesion are determined too low. If the degrees of adhesion are determined too low, the production may be stopped to improve the light applying processes.

The second threshold for the occupancy rate of the highly attached portions 34 in the determining processes is set to 0.85%. If the occupancy rates of the highly attached portions 34 are lower than 0.85%, the resin substrates 11RS and 12RS are more likely to be unexpectedly removed from the supporting substrates 30 and 31, respectively. Therefore, the deformation or the displacement of the resin substrates 11RS and 12RS are more likely to occur and thus the removals of the resin substrates 11RS and 12RS in the removing processes may become difficult. With the second threshold for the occupancy rates of the highly attached portions 34 in the removing processes set to 0.85%, conditions in which the degrees of adhesion which are too low are properly detectable.

In the separation film forming processes, the supporting substrates 30 and 31 having the light transmissivity are used for forming the separation films 32 and 33, respectively, in the light applying processes, the light is applied to the separation film 32 from the supporting substrate 30 side and to the separation film 33 from the supporting substrate 31 side. Because the supporting substrate 30 has the light transmissivity, when the light is applied from the supporting substrate 30 side, the separation film 32 is irradiated with the light that has transmitted through the supporting substrate 30. Furthermore, because the supporting substrate 31 has the light transmissivity, when the light is applied from the supporting substrate 31 side, the separation film 33 is irradiated with the light that has transmitted through the supporting substrate 31. Therefore, the thin film, components such as the TFTs 18 and the color filters 20 on the resin substrates 11RS and 12RS are less likely to be irradiated with the light and thus the thin film components such as the TFTs 18 and the color filters 20 are less likely to have the defects.

In the separation film forming processes, the separation films 32 and 33 are formed using the metal. The separation films 32 and 33 made of the refractory metal, efficiently convert the light applied in the light applying processes into heat and store the heat. Therefore, the separation is more likely to occur at the interface between the separation film 32 and the resin substrate 11RS and between the separation film 33 and the resin substrate 12RS. The degrees of adhesion between the separation film 32 and the resin substrate 11RS and between the separation film 33 and the resin substrate 12RS are more likely to decrease. The "refractory metal" refers to a metal with a melting point of 1200° C. or higher.

In the separation film forming processes, the separation, films 32 and 33 are formed using molybdenum as the refractory metal and with the thicknesses equal to or larger than 150 nm. Because the light hardly passes through the separation films 32 and 33 during the application of the light in the light applying processes, the thin film components such as the TFTs 18 and the color filters 20 are less likely to be irradiated with the light and thus the thin film components such as the TFTs 18 and the color filters 20 are less likely to have the defects. If the light is ultraviolet light and the ultraviolet light is absorbed by the resin substrates 11RS and 12RS, the surfaces of the resin substrates 11RS and 12RS may be damaged by heat produced by the light and become irregular. Therefore, a haze (a haze level) can be reduced.

In the light applying processes, the laser beams, that is, the light is applied. By applying the laser beams having high energy levels to the separation films 32 and 33 in the light applying processes, temperatures at the points to which the laser beams are applied instantaneously increase. This can accelerate the separation between the separation film 32 and the resin substrate 11RS and the separation film 33 and the resin substrate 12RS.

<Second Embodiment>

A second embodiment of the present invention will be described with reference to FIGS. 16 to 19. The second embodiment includes a method of producing a flexible scanner 35. Configurations, functions, and effects similar to those of the first embodiment will not be described.

Figure 16:
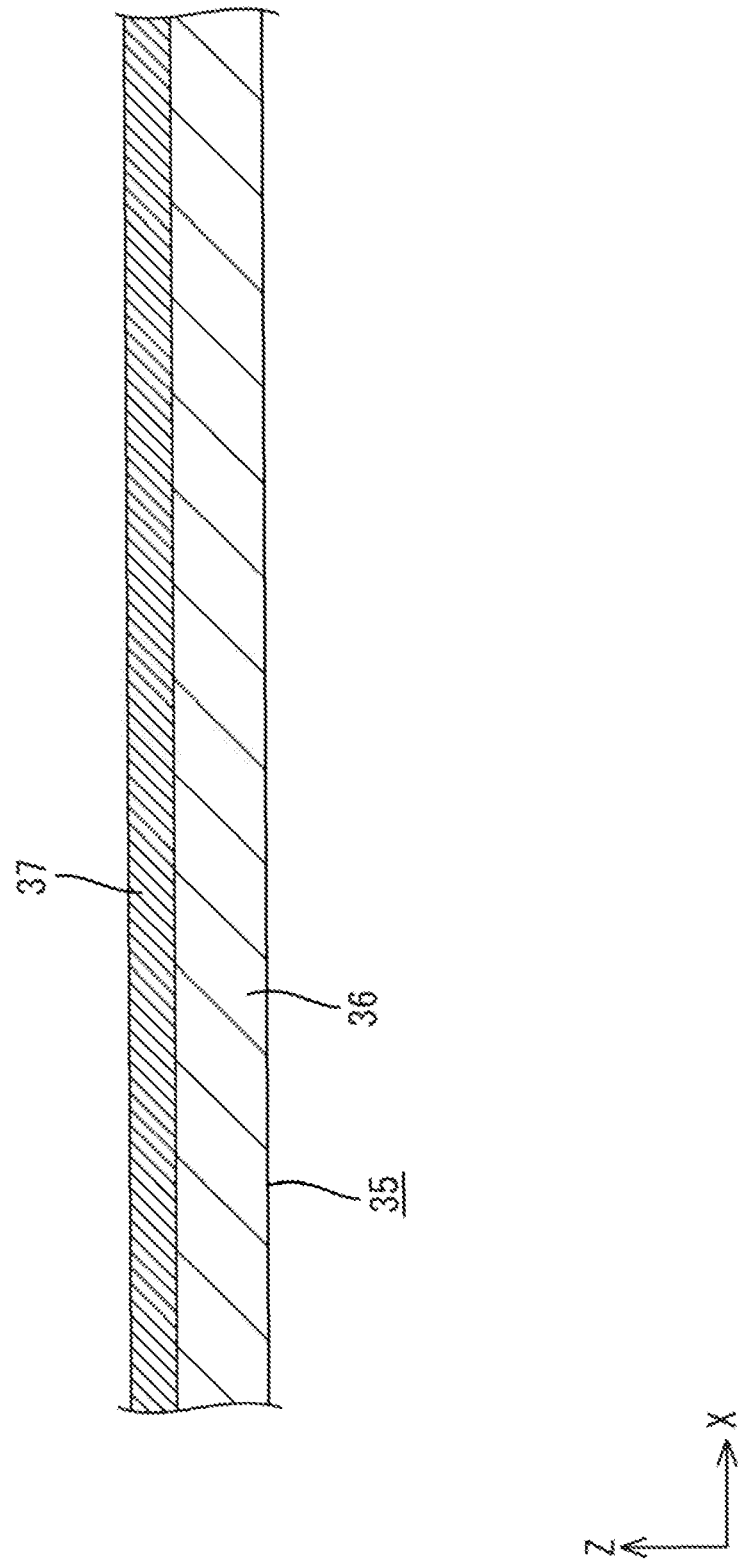
FIG. 16 is a cross-sectional view of a flexible scanner according to a second embodiment of the present invention.

As illustrated in FIG. 16, the flexible scanner 35 has flexibility and thus the flexible scanner 35 can scan objects in various three-dimensional shapes and properly obtain information from the objects. The flexible scanner 35 includes at least a resin substrate 36 and thin film components 37. The resin substrate 36 has flexibility. The thin film components 37 are formed within a plane of the resin substrate 36. The thin film components 37 include at least photodetectors and TFTs. The photodetectors are for obtain the information. The TFTs are for controlling driving of the photodetectors. The photodetectors and the TFTs are formed from various kinds of films that formed in layers on the resin substrate 36. The photodetectors are for detecting variation in intensity of the light. It is preferable for forming channels of the TFTs from an oxide semiconductor film similar to that of the first embodiment described above for increasing operation speeds of the TFTs. In FIGS. 16 to 19, the thin film components 37 are simplified.

The flexible scanner 35 having such a configuration will be produced by the following method. The method of producing the flexible scanner 35 includes a separation film forming process, a resin substrate forming process, a thin film component forming process, a light applying process, a determining process, and a removing process. In the separation film forming process, a separation film 39 is formed on a supporting substrate 38. In the resin substrate forming process, the resin substrate 36 is formed on the separation film 39. In the thin film component forming process, thin film components are formed on the resin substrate 36. In the light applying process, light is applied to the separation film 39 for accelerating separation of the resin substrate 36. In the determining process, whether a degree of adhesion between the separation film 39 and the resin substrate 36 is high or low is determined based on image data obtained through capturing of images of the separation film 39 from the resin substrate 36 side. In the removing process, the resin substrate 36 is removed from the supporting substrate 38 if the degree of adhesion is determined low in the determining process.

Figure 17:
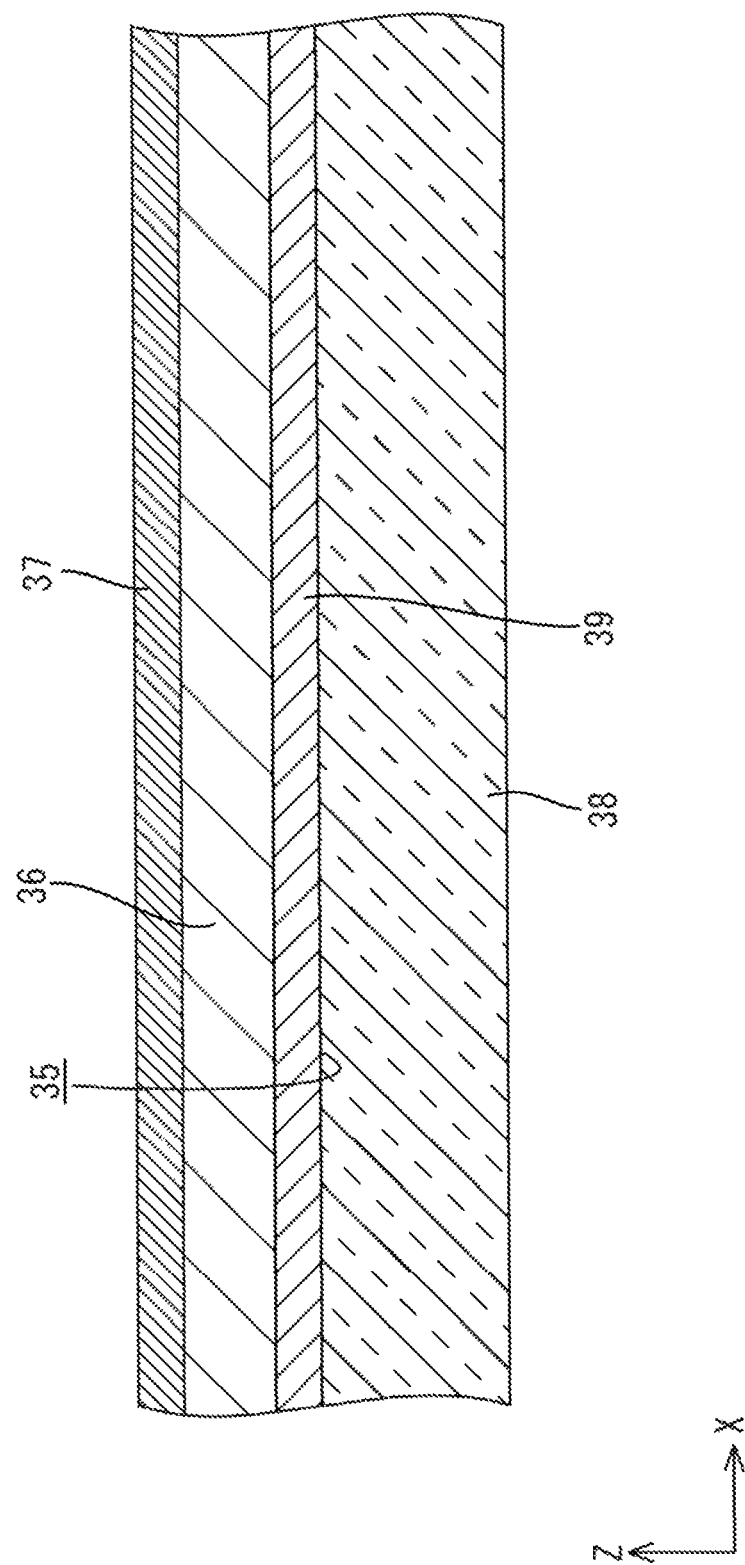
FIG. 17 is a cross-sectional view illustrating a condition in a production of the flexible scanner in which a resin substrate including in the flexible scanner is formed on a separation film that is formed on a supporting substrate and various kinds of films that form TFTs and photodetectors are formed on the resin substrate.
Figure 18:
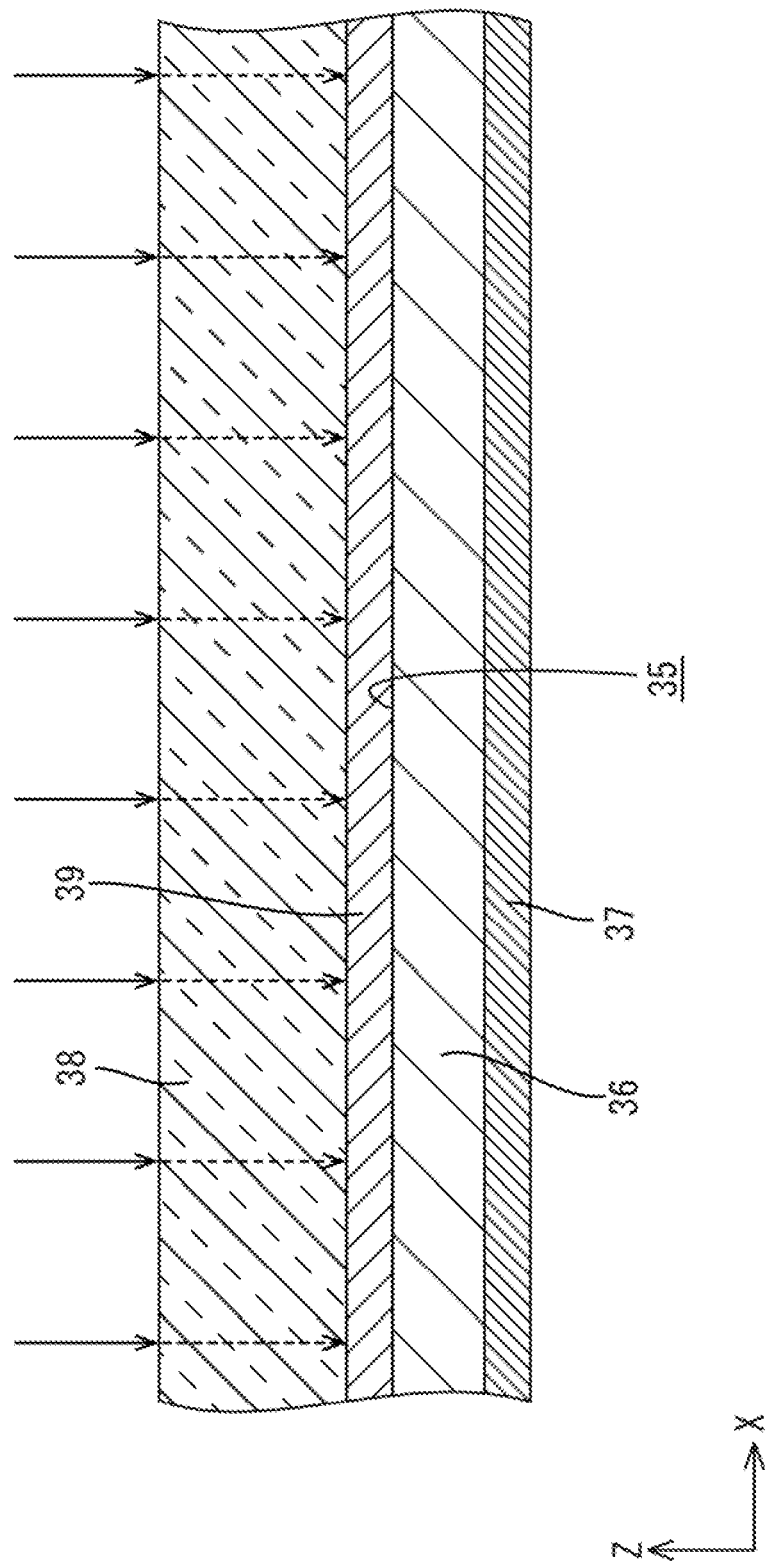
FIG. 18 is a cross-sectional view illustrating a condition in the production of the flexible scanner in which laser beams are applied through a supporting substrate that supports the flexible scanner.

As illustrated in FIG. 17, in the separation film forming process, the separating film 39 made of metal is formed on a surface of the supporting substrate 38 made of glass and having sufficient strength. An aluminosilicate glass that does not contain an alkaline component (non-alkaline, glass) may be preferable for the material of the supporting substrate 38. A refractory metal, such as molybdenum (Mo) may be preferable for the metal of the separation film 39. It is preferable to set thicknesses of the separation film 39 to 150 μm or larger. In the resin substrate forming process, a polyamide acid agent is evenly applied to a surface of the separation film 39 by slit coating or spin coating and then baking is performed to accelerate imidization. Through this process, the resin substrate 36 made of polyimide are formed. The backing is performed at a temperature 180° C. or higher to accelerate the imidization of the polyamide acid agent. In the thin film component forming process, the films are formed on the surface of the resin substrate 36 and patterned in sequence using a known photolithography technology. Through this process, the thin film components 37 are formed. The resin substrate 36 is supported with the supporting substrate 38 and thus the resin substrate 36 has the sufficient level of strength. Therefore, the films that form the thin film components 37 are formed and patterned with sufficiently high accuracy.

As illustrated in FIG. 15, in the light applying process, the supporting substrate 38 is disposed on the front side of the resin substrate 36 and laser beams, that is, light is applied to the separation film 39 from the front side. Most of the laser beams that have transmitted through the substantially transparent supporting substrate 38 and reached the separation film 39 are absorbed by the separation film 39 and converted into heat. With the laser beams, temperatures in portions of the separation film 39 to which the laser beams are applied become high (600° C. or higher). Melting may occur at an interface between the resin substrate 36 and the separation film 39. The portions of the separation film 39 to which the laser beams are applied may be removed from, the resin substrate 11RS due to a mechanical factor such as a thermal expansion difference. In FIG. 13, the laser beams are indicated with solid-line arrows or broken-line arrows.

In the determining process, images of the separation film 39 on the supporting substrate 38 for supporting the resin substrate 36 are captured. The images are processed through image thresholding and highly attached portions having high degrees of adhesion are extracted. An occupancy rate that is a percentage of areas of the extracted highly attached portions over a total area of the separation film 39 is determined. Whether the degree of adhesion is high or low is determined based on whether or not the occupancy rate is higher than a threshold. Regarding the threshold for the degree of adhesion between the separation film 39 and the resin substrate 36 in the determining process, a first threshold is set to 2.9% or 1.8% and a second threshold is set to 0.85%. If the degree of adhesion is out of a determination condition in the determining process (i.e., if the occupancy rate is higher than the first threshold or lower than the second threshold), the production may be stopped to improve the light applying process. If the degree of adhesion is within the determination condition (i.e., if the occupancy rate is equal to or lower than the first threshold and equal to or higher than the second threshold), the production proceeds to the removing process. As illustrated in FIG, 19, in the removing process, the flexible scanner 35 is removed from the supporting substrate 33. The resin substrate 36 is smoothly removed from, the separation film 39 on the supporting substrate 38 and thus the resin substrate 36 and the thin film components are less likely to be damaged due to the removal. Through the above processes, the flexible scanner 35 is produced with high yield.

<Other Embodiments>

The present invention is not limited to the embodiments, which have been described -using the foregoing descriptions and the drawings. The following embodiments may be included in the technical scope of the present invention.

(1) In the above embodiments, the molybdenum is used for the material of the separation films. However, refractory metals other than the molybdenum such as titanium (Ti), tungsten (W), and tantalum (Ta) may be used. Furthermore, it is preferable that the metal for the material of the separation films has characteristics including a melting point higher than the decomposition temperature of the resin material (e.g., polyimide) for the resin substrates and low light reflectivity. Any metals having such characteristics can be used.

(2) In each of the above embodiments, the separating films are made of a single metal. However, the separation films may be alloy films made of multiple metals. Furthermore, non-metal elements may be added to the single metal or the multiple metals.

(3) In each of the above embodiments, the separation films have the thicknesses to exhibit the sufficient levels of light blocking effects. However, the separation films may have thicknesses that may not sufficient to exhibit the sufficient levels of light blocking effects is the resin substrates are made of material that has a characteristic for absorbing ultraviolet rays and ultraviolet laser beams are used.

(4) In each of the above embodiments, the polyimide is used for the material of the resin substrates. However, polyamide (PA), polyethylene terephthalate (PET), or polyethylene naphthalate (PEN) other than the polyimide may be used.

(5) In each of the above embodiments, in the light applying process, the laser beams are produced using the solid-state laser including the yttrium vanadate crystal (YVO4) as a laser medium. However, an yttrium aluminum garnet (YAG) may be used for the laser medium.

(6) In each of the above embodiments, the laser beams with the wavelength of 355 nm produced by the solid-state laser are applied in the light applying process. Because the separation films made of metal are used, laser beams with a wavelength in a range of visible light that can pass through the polyimide of the resin substrates may be applied or excimer laser beams with a wavelength of 308 nm may be applied.

(7) In each of the above embodiments, the first threshold for the occupancy rates of the highly attached portions to determine the degrees of adhesion of the highly attached portions in the determining process is set to 2.9% or 1.8%. However, the first threshold may be set to values other than the above where appropriate.

(8) In each of the above embodiments, in the determining process, the images of the center portion of each separation film in the plane thereof and the four corners are captured. However, the number of images and the portions of the separation films to foe captured in the plane in the determining process can be altered as appropriate.

(9) In each of the above embodiments, in the determining process, whether the degrees of adhesion are high or low is determined based on whether or not the occupancy rates of the highly attached portions are higher than the threshold. However, the degrees of adhesion are high or low may be determined based on whether or not absolute values of areas of the highly attached portions are larger than thresholds.

(10) In the first embodiment, the light applying process, the determining process, and the removing process are performed for each board after the bonding process for bonding the CF board and the array board are bonded together. However, the bonding process may be performed after the light applying process, the determining process, and the removing process are performed for each board.

(11) In the first embodiment, the light applying process, the determining process, and the removing process are performed for the CF board first. However, the array board may be processes before the CF board.

(12) The materials of the films formed on the CF board and the array board may be altered from those in the first embodiment as appropriate.

(13) In each of the above embodiments, the In—Ga—Zn—O based semiconductor is used for the oxide semiconductor that is the material of the oxide semiconductor film for the channels of the TFTs, However, other kind of oxide semiconductor may be used. For example, a Zn—O based semiconductor (ZnO), an In—Zn—O base semiconductor (IZO (registered trademark)), a Zn—Ti—O based semiconductor (ZTO), a Cd—Ge—O based semiconductor, a Cd—Pb—O based semiconductor, a cadmium oxide (CdO), a Mg—Zn—O based semiconductor, an Xn—Sn—Zn—P based semiconductor (e.g., an In2O3-SnO2-ZnO), or an In—Ga—Sn—O base semiconductor may be included.

(14) In each of the above embodiments, the channels of the TFTs are formed from the oxide semiconductor film. However, the scope of the present invention may be applied to channels of TFTs formed from a semiconductor film other than the oxide semiconductor film made of amorphous silicon, polysilicon, or organic semiconductor.

(15) In each of the above embodiments, the TFTs are used as an example of the thin film components. However, the scope of the present invention may be applied to switching components other than the TFTs (e.g., photo diodes) formed as the thin film components and used as photodetectors.

(16) In each of the above embodiments, the synthetic rein is used for the material of the component supports. However, glass may foe used for the material of the component supports and the component supports may be "glass substrates."

(17) The above embodiments are the method of producing the substrates in the liquid crystal panel having flexibility and the method of producing the flexible scanner. However, the scope of the present invention can be applied to a method of producing an organic EL panel having flexibility and a method of producing a flexible panel for an X-ray sensor. The organic EL panel may include organic light emitting diodes and TFTs formed on a resin substrate having flexibility as thin film components. The flexible panel for the X-ray sensor includes scintillators, photodetectors, and TFTs formed on a resin substrate having flexibility as thin film components. The scintillators emit visible rays when excited by the X ray. The photodetectors detect visible rays emitted by the scintillators.

EXPLANATION OF SYMBOLS

11: CF board (Component board)
11RS: Resin substrate (Component support)
12: Array board (Component board)
12RS: Resin substrate (Component support)
18: TFT (Thin film component)
19: Pixel electrode (Thin film component)
20: Color filter (Thin film component)
21: Light blocking layer (Thin film component)
22: Counter electrode (Thin film component)
30, 31: Supporting substrate
32, 33: Separation film
34: Highly attached portion
35: Flexible scanner (Component board.)
36: Resin substrate (Component support)
37: Thin film component
38: Supporting substrate
39: Separation film

The invention claimed is:

1. A method of producing a component board comprising:
a separation film forming process for forming a separation film on a supporting substrate;
a component support forming process for forming a component support for forming a component support on the separation film;
a thin film component forming process for forming a thin film component on the component support;
a light applying process for applying light to the separation film for accelerating a removal of the component support;
a determining process for determining whether a degree of adhesion between the separation film and the component support is high or low based on image data obtained through capturing of an image of the separation film; and
a removing process for removing the component support from the supporting substrate if the degree of adhesion is determined low in the determining process.

2. The method according to claim 1, wherein the determining process comprises:
image thresholding the image data;
extracting a highly attached portion having a high degree of adhesion; and
determining whether or not the degree of adhesion is high or low based on whether an occupancy rate of an area of the highly attached portion over an entire area of the separation film is higher than a threshold or the area of the highly attached portion is larger than a threshold.

3. The method according to claim 2, wherein the determining process comprises:
obtaining the image data through capturing of images of multiple in-plane portions of the separation film;
extracting the highly attached portion from the image data including the images; and
determining whether or not the degree of adhesion is high or low based on whether the occupancy rate of the highly attached portion is higher than the threshold or the area of the highly attached portion is larger than the threshold.

4. The method according to claim 2, wherein the determining process comprises determining whether or not the degree of adhesion is too low based on whether the occupancy rate of the highly attached portion is higher than a second threshold or the area of the highly attached portion is larger than a second threshold, the second thresholds being lower and smaller than the respective thresholds.

5. The method according to claim 1, wherein
the supporting substrate used for forming the separation film in the separation film forming process has light transmissivity, and
the light applying process comprises applying light to the separation film from a supporting substrate side.

6. The method according to claim 5, wherein the separation film forming process comprises forming the separation film using a refractory metal.

7. The method according to claim 6, wherein the separation film forming process comprises forming the separation film using molybdenum for the refractory metal and with a thickness equal to or larger than 150 nm.

8. The method according to claim 1, wherein the light applying process comprises applying laser beams as the light.

* * * * *